US012563894B2

(12) United States Patent
Yang et al.

(10) Patent No.: US 12,563,894 B2
(45) Date of Patent: Feb. 24, 2026

(54) PROFILING AND LAMINATING DEVICE, PROFILING AND LAMINATING METHOD, DISPLAY MODULE, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chao Yang, Beijing (CN); Mengyuan Pang, Beijing (CN); Liqiang Chen, Beijing (CN); Yang Yang, Beijing (CN); Yaming Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 472 days.

(21) Appl. No.: 18/014,603

(22) PCT Filed: Nov. 16, 2021

(86) PCT No.: PCT/CN2021/130800
§ 371 (c)(1),
(2) Date: Jan. 5, 2023

(87) PCT Pub. No.: WO2022/213607
PCT Pub. Date: Oct. 13, 2022

(65) Prior Publication Data
US 2023/0255056 A1 Aug. 10, 2023

(30) Foreign Application Priority Data
Apr. 9, 2021 (CN) ........................ 202110384606.X

(51) Int. Cl.
*H10K 59/12* (2023.01)
*G09G 3/00* (2006.01)
(Continued)

(52) U.S. Cl.
CPC ........... *H10K 59/1201* (2023.02); *G09G 3/03* (2020.08); *H10K 50/842* (2023.02);
(Continued)

(58) Field of Classification Search
None
See application file for complete search history.

(56) References Cited

U.S. PATENT DOCUMENTS 10,907,077 B1 2/2021 Zhao et al.
2016/0313763 A1 10/2016 Ahn et al.
(Continued)

FOREIGN PATENT DOCUMENTS

CN 108818388 A 11/2018
CN 109272875 A 1/2019
(Continued)

OTHER PUBLICATIONS

English translation of CN 112150932 (Year: 2020).*
(Continued)

*Primary Examiner* — Anthony Ho
(74) *Attorney, Agent, or Firm* — XSENSUS LLP

(57) ABSTRACT

A profiling and laminating device includes: a fixture, a carrier film, a first driving assembly and a second driving assembly. The fixture includes a first main surface, a curved transition surface and a second main surface that are connected in sequence, and the first main surface and the second main surface are located on two opposite sides of the fixture, respectively. A surface of the carrier film is used for carrying a flexible display panel, and another surface of the carrier film is used for covering at least the first main surface and
(Continued)

200 the second main surface of the fixture. The first driving assembly is used for driving the fixture to move. The second driving assembly is used for driving the carrier film to move.

20 Claims, 16 Drawing Sheets

(51) Int. Cl.
| | |
|---|---|
| *H10K 50/842* | (2023.01) |
| *H10K 71/10* | (2023.01) |
| *H10K 71/50* | (2023.01) |

(52) U.S. Cl.
CPC ........... *H10K 71/191* (2023.02); *H10K 71/50* (2023.02); *G09G 2310/0264* (2013.01)

(56) References Cited

U.S. PATENT DOCUMENTS

| | | | |
|---|---|---|---|
| 2019/0150302 A1 | 5/2019 | Heng | |
| 2019/0165332 A1 | 5/2019 | Kwon et al. | |
| 2021/0096601 A1 | 4/2021 | Chen et al. | |
| 2022/0126408 A1 | 4/2022 | Deng et al. | |
| 2022/0288911 A1 | 9/2022 | Mo et al. | |
| 2023/0176621 A1 | 6/2023 | Zhou et al. | |
| 2023/0180448 A1 | 6/2023 | Wang et al. | |

FOREIGN PATENT DOCUMENTS

| | | | |
|---|---|---|---|
| CN | 109532193 A | 3/2019 |
| CN | 109637366 A | 4/2019 |
| CN | 109677091 A | 4/2019 |
| CN | 109754713 A | 5/2019 |
| CN | 110728909 A | 1/2020 |
| CN | 110865740 A | 3/2020 |
| CN | 110930882 A | 3/2020 |
| CN | 111261046 A | 6/2020 |
| CN | 111284110 A | 6/2020 |
| CN | 111546749 A | 8/2020 |
| CN | 111546750 A | 8/2020 |
| CN | 111862824 A | 10/2020 |
| CN | 111968505 A | 11/2020 |
| CN | 112150932 A | 12/2020 |
| CN | 112265281 A | 1/2021 |
| CN | 112289189 A | 1/2021 |
| CN | 212266952 U | 1/2021 |
| CN | 112384004 A | 2/2021 |
| CN | 113035084 A | 6/2021 |
| JP | 2019-077172 A | 5/2019 |

OTHER PUBLICATIONS

Su Lumei et al., Visual Guidance based Automatic Touchscreen Fitting System, Journal of Xiamen University of Technology, Feb. 2017, vol. 25 No. 1.

Notification to Grant Patent Right for Invention for the Chinese Patent Application No. 202110384606.X issued by the Chinese Patent Office on Sep. 28, 2022.

The First Office Action for the Chinese Patent Application No. 202110384606.X issued by the Chinese Patent Office on Jun. 23, 2022.

* cited by examiner

10
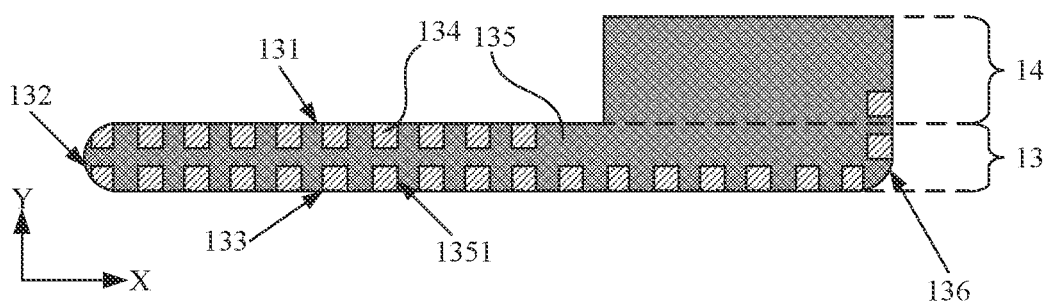
FIG. 7
10
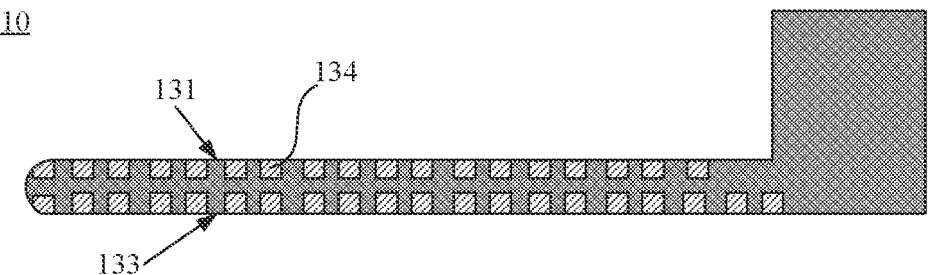
FIG. 8
200
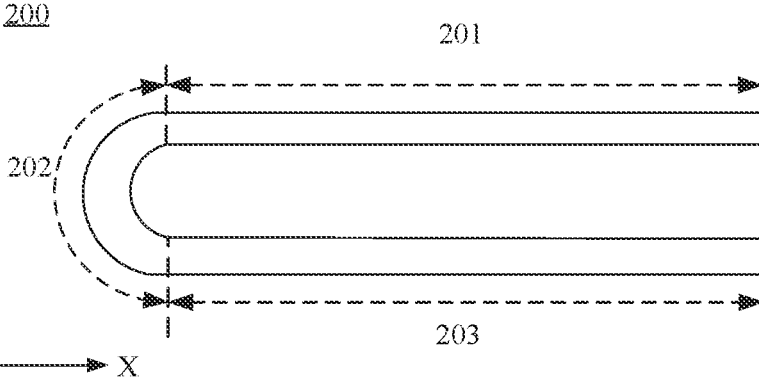
FIG. 9

100

100

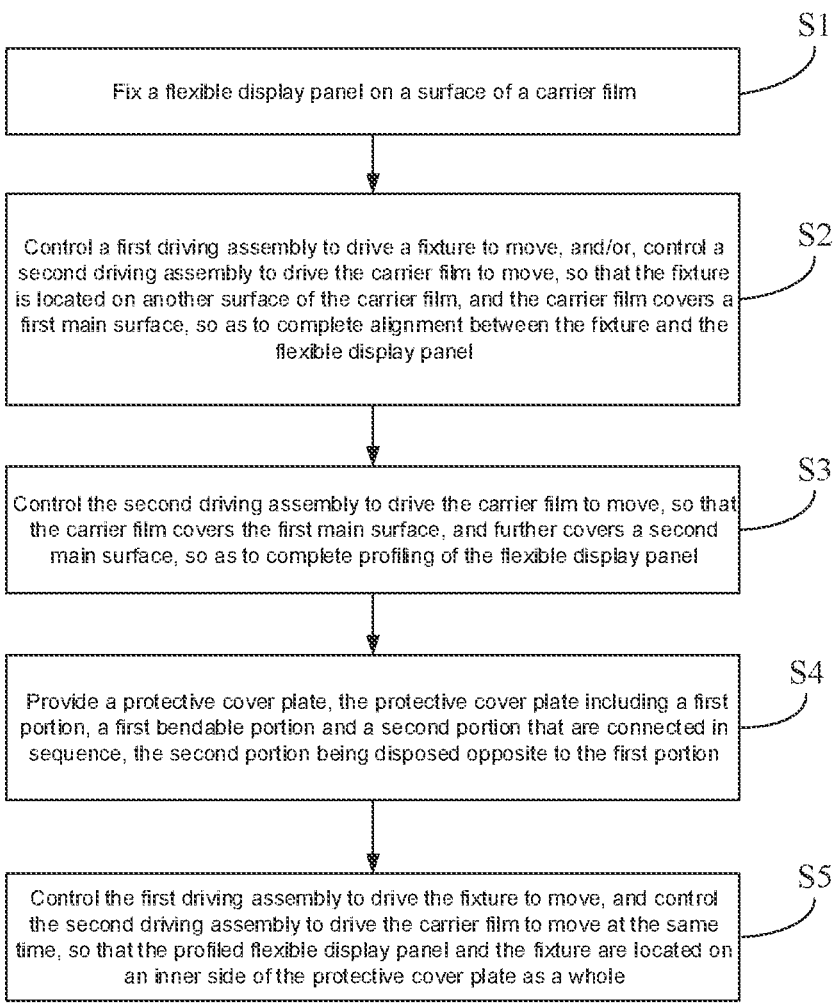

S1

Fix a flexible display panel on a surface of a carrier film

S2

Control a first driving assembly to drive a fixture to move, and/or, control a second driving assembly to drive the carrier film to move, so that the fixture is located on another surface of the carrier film, and the carrier film covers a first main surface, so as to complete alignment between the fixture and the flexible display panel

S3

Control the second driving assembly to drive the carrier film to move, so that the carrier film covers the first main surface, and further covers a second main surface, so as to complete profiling of the flexible display panel

S4

Provide a protective cover plate, the protective cover plate including a first portion, a first bendable portion and a second portion that are connected in sequence, the second portion being disposed opposite to the first portion

S5

Control the first driving assembly to drive the fixture to move, and control the second driving assembly to drive the carrier film to move at the same time, so that the profiled flexible display panel and the fixture are located on an inner side of the protective cover plate as a whole

FIG. 17

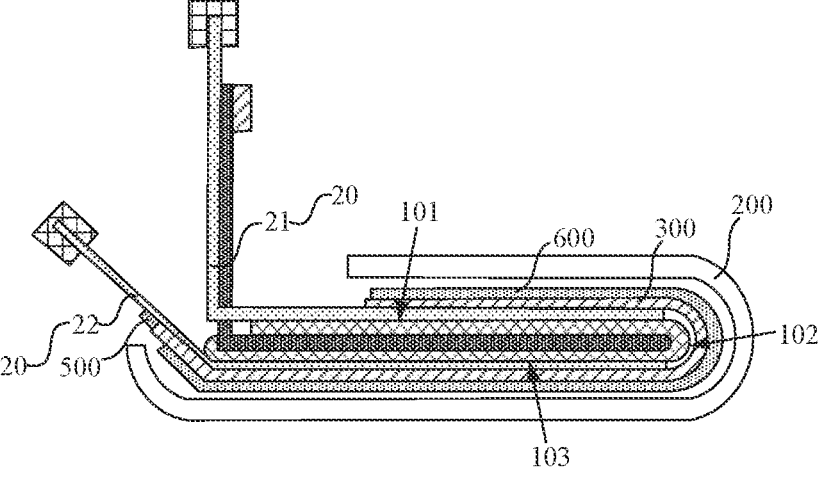

FIG. 18

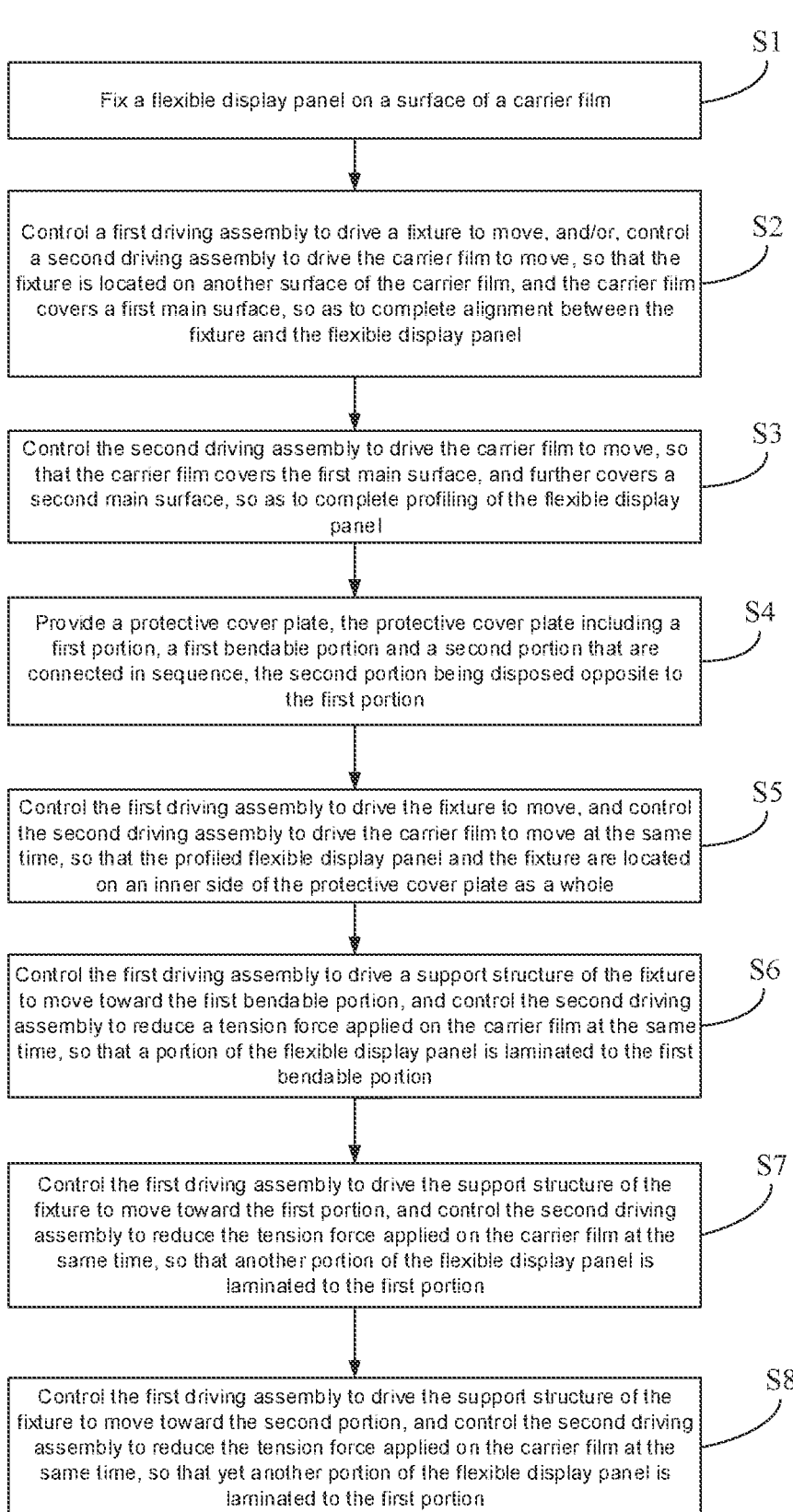

S1

Fix a flexible display panel on a surface of a carrier film

S2

Control a first driving assembly to drive a fixture to move, and/or, control a second driving assembly to drive the carrier film to move, so that the fixture is located on another surface of the carrier film, and the carrier film covers a first main surface, so as to complete alignment between the fixture and the flexible display panel

S3

Control the second driving assembly to drive the carrier film to move, so that the carrier film covers the first main surface, and further covers a second main surface, so as to complete profiling of the flexible display panel

S4

Provide a protective cover plate, the protective cover plate including a first portion, a first bendable portion and a second portion that are connected in sequence, the second portion being disposed opposite to the first portion

S5

Control the first driving assembly to drive the fixture to move, and control the second driving assembly to drive the carrier film to move at the same time, so that the profiled flexible display panel and the fixture are located on an inner side of the protective cover plate as a whole

S6

Control the first driving assembly to drive a support structure of the fixture to move toward the first bendable portion, and control the second driving assembly to reduce a tension force applied on the carrier film at the same time, so that a portion of the flexible display panel is laminated to the first bendable portion

S7

Control the first driving assembly to drive the support structure of the fixture to move toward the first portion, and control the second driving assembly to reduce the tension force applied on the carrier film at the same time, so that another portion of the flexible display panel is laminated to the first portion

S8

Control the first driving assembly to drive the support structure of the fixture to move toward the second portion, and control the second driving assembly to reduce the tension force applied on the carrier film at the same time, so that yet another portion of the flexible display panel is laminated to the first portion

FIG. 19

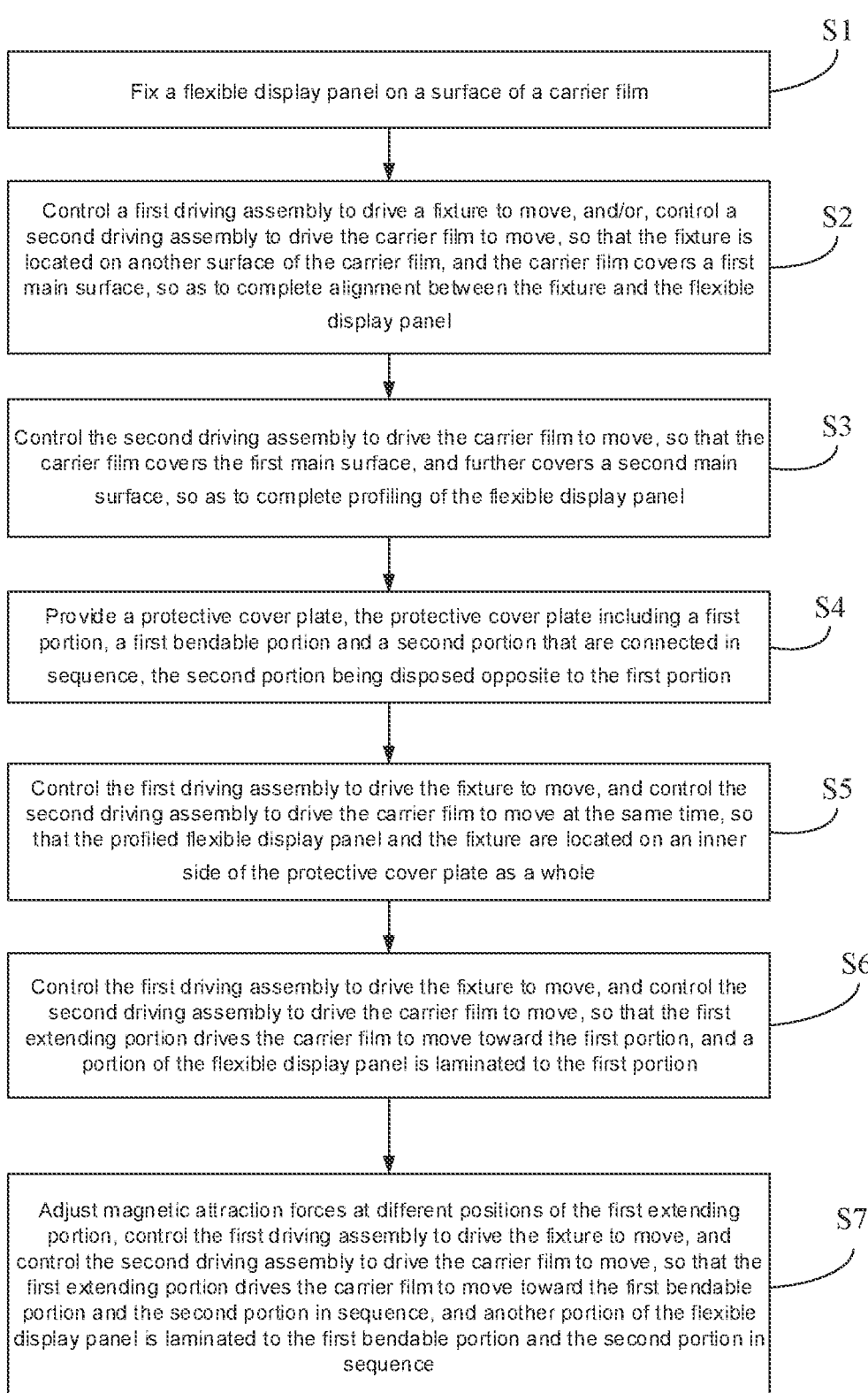

S1

Fix a flexible display panel on a surface of a carrier film

S2

Control a first driving assembly to drive a fixture to move, and/or, control a second driving assembly to drive the carrier film to move, so that the fixture is located on another surface of the carrier film, and the carrier film covers a first main surface, so as to complete alignment between the fixture and the flexible display panel

S3

Control the second driving assembly to drive the carrier film to move, so that the carrier film covers the first main surface, and further covers a second main surface, so as to complete profiling of the flexible display panel

S4

Provide a protective cover plate, the protective cover plate including a first portion, a first bendable portion and a second portion that are connected in sequence, the second portion being disposed opposite to the first portion

S5

Control the first driving assembly to drive the fixture to move, and control the second driving assembly to drive the carrier film to move at the same time, so that the profiled flexible display panel and the fixture are located on an inner side of the protective cover plate as a whole

S6'

Control the first driving assembly to drive the fixture to move, and control the second driving assembly to drive the carrier film to move, so that the first extending portion drives the carrier film to move toward the first portion, and a portion of the flexible display panel is laminated to the first portion

S7'

Adjust magnetic attraction forces at different positions of the first extending portion, control the first driving assembly to drive the fixture to move, and control the second driving assembly to drive the carrier film to move, so that the first extending portion drives the carrier film to move toward the first bendable portion and the second portion in sequence, and another portion of the flexible display panel is laminated to the first bendable portion and the second portion in sequence

FIG. 25

PROFILING AND LAMINATING DEVICE, PROFILING AND LAMINATING METHOD, DISPLAY MODULE, AND DISPLAY DEVICE

CROSS-REFERENCE TO RELATED APPLICATIONS

This application is a national phase entry under 35 USC 371 of International Patent Application No. PCT/CN2021/130800, filed on Nov. 16, 2021, which claims priority to Chinese Patent Application No. 202110384606.X, filed on Apr. 9, 2021, which are incorporated herein by reference in their entirety.

TECHNICAL FIELD

The present disclosure relates to the field of display technologies, and in particular, to a profiling and laminating device, a profiling and laminating method, a display module, and a display device.

BACKGROUND

Organic light-emitting diode (OLED) display devices have the advantages of light weight, small thickness, high brightness, low power consumption, fast response, high definition, good flexibility and good luminous efficiency, thus have broad application prospects. In recent years, high screen-to-body ratio has gradually become the mainstream design in the display field, and has been favored by consumers. The high screen-to-body ratio display of OLED display devices has also become the main research direction in the display field.

SUMMARY

In an aspect, a profiling and laminating device is provided. The profiling and laminating device includes a fixture, a carrier film, a first driving assembly and a second driving assembly. The fixture includes a first main surface, a curved transition surface and a second main surface that are connected in sequence, and the first main surface and the second main surface are located on two opposite sides of the fixture. A surface of the carrier film is used for carrying a flexible display panel, and another surface of the carrier film is used for covering at least the first main surface and the second main surface of the fixture. The first driving assembly is used for driving the fixture to move. The second driving assembly is used for driving the carrier film to move.

In some embodiments, the fixture includes a support structure and a flexible wrapping structure. The support structure includes a first support portion and a second support portion. The first support portion extends in a first direction. The first support portion includes a first support surface, a first end surface, a second support surface and a second end surface that are connected end to end in sequence. The second support portion is connected to the first support surface and extends in a second direction intersecting the first direction. The flexible wrapping structure includes a first wrapping portion, a first curved wrapping portion and a second wrapping portion that are connected in sequence. The first wrapping portion covers the first support surface, the first curved wrapping portion covers the first end surface, and the second wrapping portion covers the second support surface. A surface of the first wrapping portion away from the first support surface is the first main surface, a surface of the first curved wrapping portion away from the first end surface is the curved transition surface, and a surface of the second wrapping portion away from the second support surface is the second main surface.

In some embodiments, the second support portion is provided therein with an opening penetrating the second support portion in the first direction, and the opening is located on a side, proximate to the first support portion, of a plane where the first main surface is located.

In some embodiments, a thickness of the first wrapping portion is less than a thickness of the first curved wrapping portion; and/or, a thickness of the second wrapping portion is less than the thickness of the first curved wrapping portion.

In some embodiments, the thickness of the first wrapping portion is one third of the thickness of the first curved wrapping portion; and/or, the thickness of the second wrapping portion is one third of the thickness of the first curved wrapping portion.

In some embodiments, the flexible wrapping structure further includes a second curved wrapping portion connected to an end of the second wrapping portion away from the first curved wrapping portion; and the second curved wrapping portion covers at least part of the second end surface.

In some embodiments, the second support portion is further provided therein with a plurality of positioning holes, and the plurality of positioning holes are located on a side, away from the first support portion, of a plane where the first main surface is located.

In some embodiments, the second support portion is connected to a portion of the first support surface proximate to the second end surface.

In some embodiments, the fixture includes a first extending portion and a second extending portion. The first extending portion extends in a first direction. The first extending portion includes a first extending surface, a first curved extending surface and a second extending surface that are connected in sequence. The first extending surface is used as the first main surface, the first arc extending surface is used as the curved transition surface, and the second extending surface is used as the second main surface. The second extending portion is connected to the first extending surface and extends in a second direction intersecting the first direction. The first extending portion is configured to generate magnetic attraction force after being energized, and the carrier film is configured to be attracted by the magnetic attraction force generated by the first extending portion.

In some embodiments, the first extending portion includes a plurality of electromagnetic coils and an extending body extending in the first direction. A surface of the extending body has a plurality of grooves, and at least one electromagnetic coil of the plurality of electromagnetic coils is disposed in a groove of the plurality of grooves.

In some embodiments, a number of electromagnetic coils proximate to the first extending surface is less than a number of electromagnetic coils proximate to the second extending surface.

In some embodiments, the first extending portion further includes a second curved extending surface that connects the first extending surface and the second extending surface.

In some embodiments, the first extending portion includes a plurality of electromagnetic coils; the second extending portion is connected to an edge portion of the first extending surface connected to the second curved extending surface, a surface of the second extending portion is smoothly connected to the second curved extending surface, and at least one electromagnetic coil of the plurality of electromagnetic coils is embedded in a surface of the second extending portion proximate to the second curved extending surface; or, the second extending portion is connected to a middle portion of the first extending surface in the first direction; in all electromagnetic coils of the plurality of electromagnetic coils proximate to the first extending surface, a number of electromagnetic coils located on one side of two opposite sides of the first extending portion is different from a number of electromagnetic coils located on another side of the two opposite sides of the first extending portion.

In some embodiments, the carrier film includes a first carrier portion and a second carrier portion. The first carrier portion is configured to cover the first main surface under driving of the second driving assembly. The second carrier portion is configured to cover the second main surface under driving of the second driving assembly.

In some embodiments, the profiling and laminating device further includes a filling portion that connects the first carrier portion and the second carrier portion; an elastic modulus of the filling portion is less than an elastic modulus of the first carrier portion; and/or, the elastic modulus of the filling portion is less than an elastic modulus of the second carrier portion.

In some embodiments, an elastic modulus of the carrier film is in a range from 3.8 Gpa to 9.9 Gpa, inclusive.

In some embodiments, the profiling and laminating device further includes an optical adhesive layer located on a surface of the carrier film that is used for carrying the flexible display panel, and an elastic modulus of the optical adhesive layer is in a range from 20 Gpa to 110 Gpa, inclusive.

In another aspect, a profiling and laminating method is provided. The profiling and laminating method is applied to the profiling and laminating device as described in any one of the above embodiments. The profiling and laminating method includes: fixing the flexible display panel on the surface of the carrier film; controlling the first driving assembly to drive the fixture to move, and/or, controlling the second driving assembly to drive the carrier film to move, so that the fixture is located on the another surface of the carrier film, and the carrier film covers the first main surface, so as to complete alignment between the fixture and the flexible display panel; and controlling the second driving assembly to drive the carrier film to move, so that the carrier film covers the first main surface and the second main surface, so as to complete profiling of the flexible display panel.

In some embodiments, the profiling and laminating method further includes: providing a protective cover plate, the protective cover plate including a first portion, a first bendable portion and a second portion that are connected in sequence, the second portion being arranged opposite to the first portion; and controlling the first driving assembly to drive the fixture to move, and at a same time controlling the second driving assembly to drive the carrier film to move, so that the profiled flexible display panel and the fixture are located on an inner side of the protective cover plate as a whole.

In some embodiments, in a case where the fixture includes a support structure and a flexible wrapping structure, the profiling and laminating method further includes: controlling the first driving assembly to drive the support structure of the fixture to move toward the first bendable portion, and at a same time controlling the second driving assembly to reduce a tension force applied on the carrier film, so that a portion of the flexible display panel is laminated to the first bendable portion; controlling the first driving assembly to drive the support structure of the fixture to move toward the first portion, and at a same time controlling the second driving assembly to reduce the tension force applied on the carrier film, so that another portion of the flexible display panel is laminated to the first portion; and controlling the first driving assembly to drive the support structure of the fixture to move toward the second portion, and at a same time controlling the second driving assembly to reduce the tension force applied on the carrier film, so that yet another portion of the flexible display panel is laminated to the second portion.

In some embodiments, in a case where the flexible wrapping structure further includes a second curved wrapping portion and the protective cover plate includes a second bendable portion connected to an end of the second portion away from the first bendable portion, after the yet another portion of the flexible display panel is laminated to the second portion, the profiling and laminating method further includes: controlling the first driving assembly to drive the support structure of the fixture to move toward the second bendable portion, so that still another portion of the flexible display panel is laminated to the second bendable portion.

In some embodiments, in a case where the fixture includes a first extending portion and a second extending portion, the profiling and laminating method further includes: controlling the first driving assembly to drive the fixture to move, and controlling the second driving assembly to drive the carrier film to move, so that the first extending portion drives the carrier film to move toward the first portion, and a portion of the flexible display panel is laminated to the first portion; and adjusting magnetic attraction forces at different positions of the first extending portion, controlling the first driving assembly to drive the fixture to move, and controlling the second driving assembly to drive the carrier film to move, so that the first extending portion drives the carrier film to move toward the first bendable portion and the second portion in sequence, and another portion of the flexible display panel is laminated to the first bendable portion and the second portion in sequence.

In yet another aspect, a display module is provided. The display module is manufactured by the profiling and laminating method as described in any one of the above embodiments.

In yet another aspect, a display device is provided. The display device includes the display module as described in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

FIG. 7 is a structural diagram of yet another fixture, in accordance with some embodiments;

FIG. 8 is a structural diagram of yet another fixture, in accordance with some embodiments;

FIG. 9 is a structural diagram of another protective cover plate, in accordance with some embodiments;

FIG. 17 is a flow diagram of another profiling and laminating method, in accordance with some embodiments;

FIG. 18 is a diagram showing a state in which a flexible display panel is aligned with a protective cover plate by using a profiling and laminating device, in accordance with some embodiments;

FIG. 19 is a flow diagram of yet another profiling and laminating method, in accordance with some embodiments;

FIG. 25 is a flow diagram of yet another profiling and laminating method, in accordance with some embodiments;

DETAILED DESCRIPTION

Figure 1:
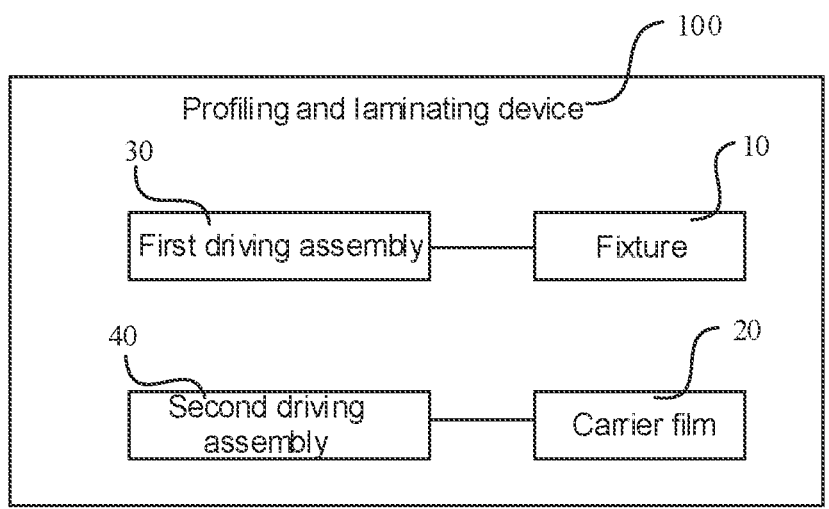
FIG. 1 is a structural diagram of a profiling and laminating device, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, the term "comprise" and other forms thereof such as the third-person singular form "comprises" and the present participle form "comprising" throughout the specification and the claims are construed as an open and inclusive meaning, i.e., "including, but not limited to". In the description of the specification, the terms such as "one embodiment" "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with the term "first" or "second" may explicitly or implicitly include one or more of the features. In the description of the embodiments of the present disclosure, the term "multiple", "a plurality of" or "the plurality of" means two or more unless otherwise specified.

In the description of some embodiments, the terms "coupled", "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" as used herein means an open and inclusive expression, which does not exclude devices that are applicable to or configured to perform additional tasks or steps.

In addition, the phrase "based on" as used herein means an open and inclusive expression, since a process, step, calculation or other action that is "based on" one or more of the stated conditions or values may, in practice, be based on additional conditions or values beyond those stated.

As used herein, the term such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary accompanying drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Figure 2:
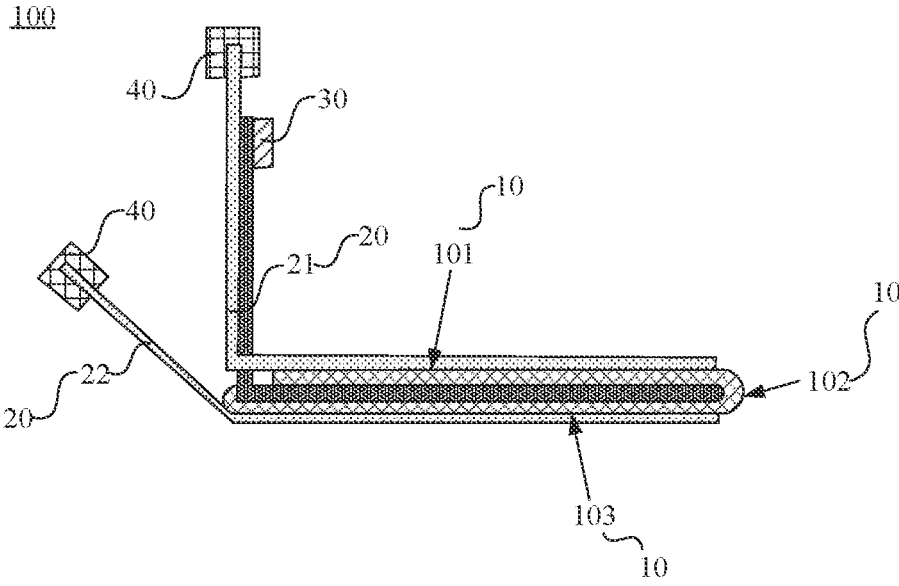
FIG. 2 is a structural diagram of another profiling and laminating device, in accordance with some embodiments.

Some embodiments of the present disclosure provide a profiling and laminating device. As shown in FIGS. 1 and 2, the profiling and laminating device 100 includes a fixture 10, a carrier film 20, a first driving assembly 30 and a second driving assembly 40. The fixture 10 includes a first main surface 101, a curved transition surface 102 and a second main surface 103 that are connected in sequence. The first main surface 101 and the second main surface 103 are located on two opposite sides of the fixture 10, respectively. A surface of the carrier film 20 is used for carrying a flexible display panel. Another surface of the carrier film 20 is used for covering at least the first main surface 101 and the second main surface 103 of the fixture 10. The first driving assembly 30 is used for driving the fixture 10 to move. The second driving assembly 40 is used for driving the carrier film 20 to move.

For example, the first main surface 101 and the second main surface 103 may be parallel to each other (as shown in FIG. 2). Alternatively, for example, the first main surface 101 and the second main surface 103 may not be parallel to each other.

The description "the first driving assembly 30 is used for driving the fixture 10 to move" may, for example, have the following situations: the first driving assembly 30 drives the fixture 10 to move in a process of aligning the fixture 10 with the flexible display panel placed on the carrier film 20; alternatively, after the flexible display panel is profiled, the first driving assembly 30 drives the fixture 10 covered by the profiled flexible display panel to move in a process of aligning the profiled flexible display panel with a protective cover plate: alternatively, after the profiled flexible display panel is aligned with the protective cover plate, the first driving assembly 30 drives the fixture 10 to move in a process of laminating the profiled flexible display panel to the protective cover plate.

The description "the second driving assembly 40 is used for driving the carrier film 20 to move" may, for example, have the following situations: the second driving assembly 40 drives the carrier film 20 to move in a process of aligning the flexible display panel placed on the carrier film 20 with the fixture 10; alternatively, the second driving assembly 40 drives the carrier film 20 to move in a profiling process of the flexible display panel; alternatively, the second driving assembly 40 drives the carder film 20 to move in a process of aligning the profiled display panel with the protective cover plate; alternatively, the second driving assembly 40 drives the carrier film 20 to move in a process of laminating the flexible display panel to the protective cover plate.

In some examples, the carrier film 20 has a one-piece structure. In some other examples, the carrier film 20 has a segmented structure; in this case, the carrier film 20 may include at least two carrier portions that are independent from each other.

The description "another surface of the carrier film 20 is used for covering at least the first main surface 101 and the second main surface 103 of the fixture 10" may, for example, have the following situations: the another surface of the carrier film 20 covers only the first main surface 101 and the second main surface 103 of the fixture 10 (for example, two independent carrier portions cover the first main surface 101 and the second main surface 103 of the fixture 10, respectively); alternatively, the another surface of the carrier film 20 covers the first main surface 101, the curved transition surface 102 and the second main surface 103 of the fixture 10 (for example, the carrier film 20 with the one-piece structure covers the first main surface 101, the curved transition surface 102 and the second main surface 103 of the fixture 10).

It is worth noting that, in a case where the another surface of the carrier film 20 covers the first main surface 101 and the second main surface 103, the another surface of the carrier film 20 may cover part of the first main surface 101 or the entire first main surface 101, and may cover part of the second main surface 103 or the entire second main surface 103. Similarly, in a case where the another surface of the carrier film 20 also covers the curved transition surface 102, the another surface of the carrier film 20 may cover part of the curved transition surface 102 or the entire curved transition surface 102.

In a process of manufacturing a display module by using the profiling and laminating device 100 provided in the embodiments of the present disclosure, the flexible display panel is firstly placed on the carrier film 20, the first driving component 30 drives the fixture 10 to move, and the second driving assembly 40 drives the carrier film 20 to move, so that the another surface of the carrier film 20 may cover at least the first main surface 101 and the second main surface 103 of the fixture 10; in this case, since the flexible display panel is placed on a surface of the carrier film 20, the carrier film 20 may drive the flexible display panel to move, and the flexible display panel may also cover at least the first main surface 101 and the second main surface 103 of the fixture 10. Thus, the flexible display panel is profiled, and the profiled flexible display panel may be a wraparound flexible display panel. Then, the first driving assembly 30 is controlled to drive the fixture 10 to move again, and the second driving assembly 40 is controlled to drive the carrier film 20 to move again, so that the profiled flexible display panel and the protective cover plate may be aligned and laminated, so as to assemble the profiled flexible display panel and the protective cover plate into the display module. A display device that adopts the display module may realize double-sided display and edge-side display. As a result, it is conducive to increasing the screen-to-body ratio of the display device.

Figure 3:
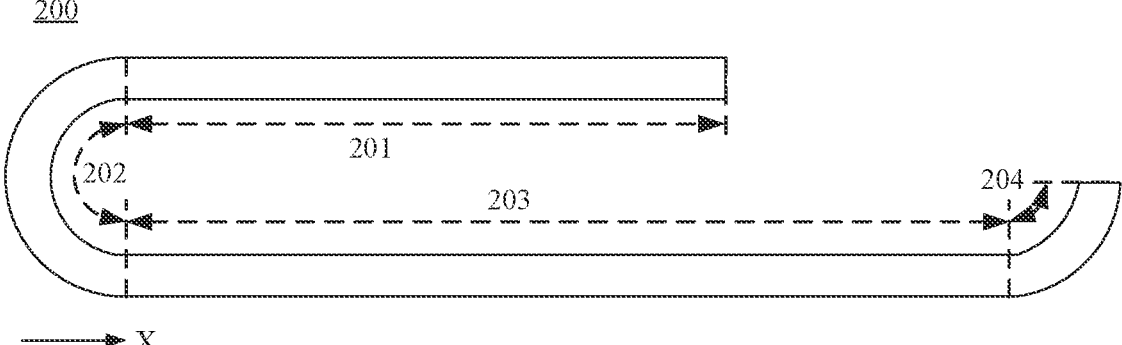
FIG. 3 is a structural diagram of a protective cover plate, in accordance with some embodiments.

For example, as shown in FIG. 3, the wraparound protective cover plate 200 may include a first portion 201, a first bendable portion 202 and a second portion 203 that are connected in sequence. The first portion 201 is disposed opposite to the second portion 203.

The first bendable portion 202 may be in a shape of a semi-circular arc (as shown in FIG. 3), or the first bendable portion 202 may be in a shape of a semi-elliptical arc. The shape of the first bendable portion 202 of the protective cover plate 200 in the embodiments of the present disclosure is not limited thereto, as long as the protective cover plate 200 is a wraparound protective cover plate.

Figure 4:
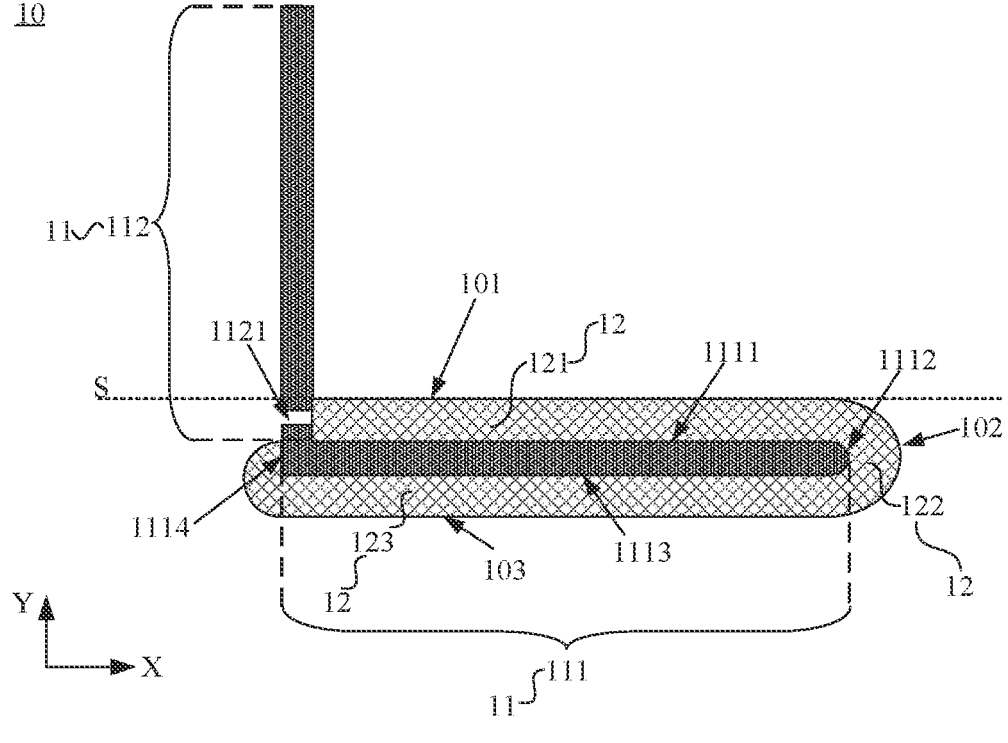
FIG. 4 is a structural diagram of a fixture, in accordance with some embodiments.

In some embodiments, as shown in FIG. 4, the fixture 10 includes a support structure 11 and a flexible wrapping structure 12. The support structure 11 includes a first support portion 111 and a second support portion 112. The first support portion 111 extends in a first direction X. The first support portion 111 includes a first support surface 1111, a first end surface 1112, a second support surface 1113 and a second end surface 1114 that are connected end to end in sequence. The second support portion 112 is connected to the first support surface 1111, and the second support portion 112 extends in a second direction Y, the second direction Y intersecting the first direction X. The flexible wrapping structure 12 includes a first wrapping portion 121, a first curved wrapping portion 122 and a second wrapping portion 123 that are connected in sequence. The first wrapping portion 121 covers the first support surface 1111, the first curved wrapping portion 122 covers the first end surface 1112, and the second wrapping portion 123 covers the second support surface 1113.

A surface of the first wrapping portion 121 away from the first support surface 1111 is the first main surface 101, a surface of the first curved wrapping portion 122 away from the first end surface 1112 is the curved transition surface 102, and a surface of the second wrapping portion 123 away from the second support surface 1113 is the second main surface 103.

For example, a material of the support structure 11 may include iron or other materials with approximately the same hardness as iron. A material of the flexible wrapping structure 12 may include silicone or foam.

For example, the first support surface 1111 and the second support surface 1113 may be parallel to each other (as shown in FIG. 4). Alternatively, for example, the first support surface 1111 and the second support surface 1113 may not be parallel to each other.

For example, the first driving assembly 30 is connected to the fixture 10; for example, the first driving assembly 30 is connected to the support structure 11 of the fixture 10.

As shown in FIG. 4, for example, the first end surface 1112 is a curved end surface, and the second end surface 1114 is a flat surface. For example, the first direction X and the second direction Y are perpendicular to each other.

In the fixture 10 provided in the embodiments of the present disclosure, the flexible wrapping structure 12 covers the first support surface 1111, the first end surface 1112 and the second support surface 1113. The flexible wrapping structure 12 may play a buffering role, so as to avoid a situation that the carrier film 20 and the flexible display panel are squeezed and damaged caused by the excessive movement of the support structure 11 in a process of laminating the flexible display panel to the protective cover plate 200. In addition, based on the deformation of the flexible wrapping structure 12 after being squeezed, the profiled flexible display panel may be fully laminated to the protective cover plate 200, which may reduce bubbles between the profiled flexible display panel and the protective cover plate 200 that are laminated together, and improve the yield of the laminated product (the display module). For example, in a process of laminating the flexible display panel to an inner surface of the first bendable portion 202 of the protective cover plate 200, by driving the support structure 11 to move and pressing the first curved wrapping portion 122 of the flexible wrapping structure 12, the flexible display panel may be fully laminated to the inner surface of the first bendable portion 202 of the protective cover plate 200.

Figure 5:
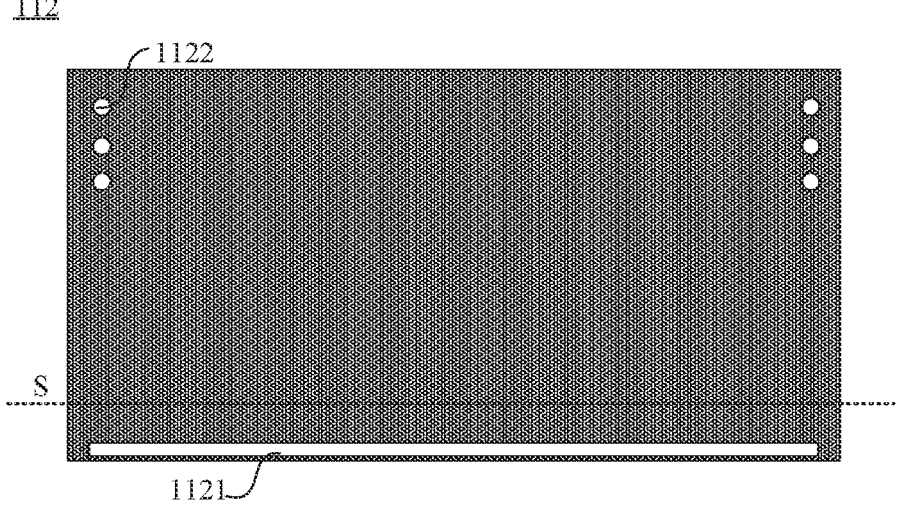
FIG. 5 is a structural diagram of a second support portion, in accordance with some embodiments.

In some embodiments, referring to FIGS. 4 and 5, the second support portion 112 is provided therein with an opening 1121 penetrating the second support portion 112 in the first direction X, and the opening 1121 is located on a side, proximate to the first support portion 111, of a plane S where the first main surface 101 is located.

The shape and size of the opening is not limited in the present disclosure, as long as the carrier film 20 may pass through the opening 1121 and cover the first main surface 101. For example, referring to FIG. 4, an orthogonal projection of the opening 1121 on a plane parallel to the second support portion 112 is in a shape of a rectangle.

In this way, in a case where the carrier film 20 passes through the opening 1121 and covers the first main surface 101, a portion of the carrier film 20 covering the first main surface 101 may be subjected an oblique downward force, thereby pressing the first wrapping portion 121; therefore, the carrier film 20 and the fixture have a small gap therebetween, and the profiled flexible display panel and the fixture have a small gap therebetween. In this way, after the profiled flexible display panel is aligned with the protective cover plate 200, there is a large gap between the profiled flexible display panel and the protective cover plate 200, and the profiled flexible display panel is not easily in contact with the protective cover plate 200 before the laminating process. Therefore, it may be possible to ameliorate the problem that bubbles are generated in the process of laminating the profiled flexible display panel to the protective cover plate 200, or the profiled flexible display panel is in contact with the protective cover plate 200 in advance, which results in the failure of the laminating process.

Figure 6:
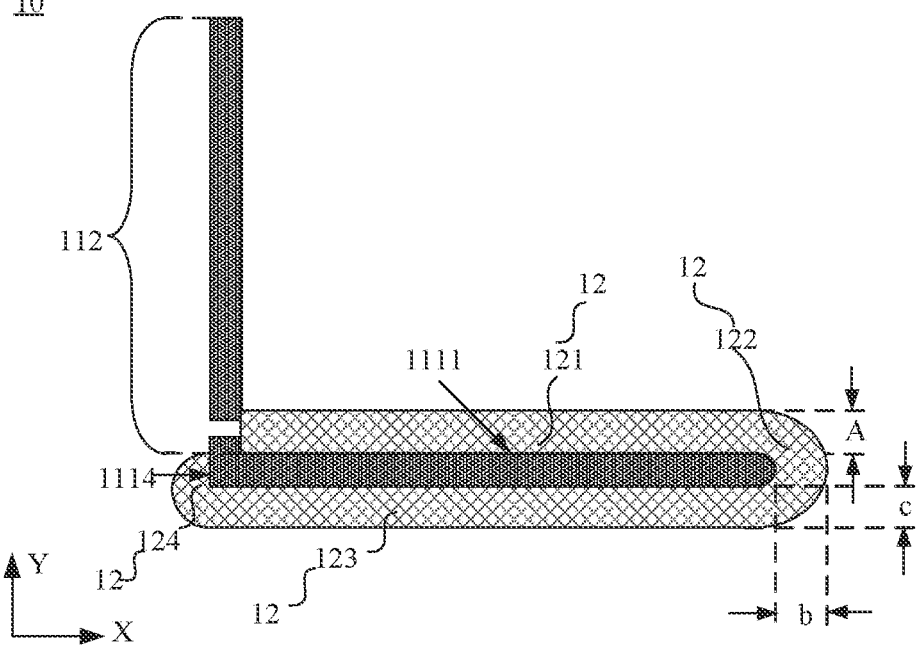
FIG. 6 is a structural diagram of another fixture, in accordance with some embodiments.

In some embodiments, as shown in FIG. 6, a thickness A of the first wrapping portion 121 is less than a thickness b of the first curved wrapping portion 122. In some other embodiments, a thickness c of the second wrapping portion 123 is less than the thickness b of the first curved wrapping portion 122. In yet some other embodiments, the thickness A of the first wrapping portion 121 and the thickness c of the second wrapping portion 123 are each less than the thickness b of the first curved wrapping portion 122.

In this way, the thickness of the first curved wrapping portion 122 is relatively large. In a process of laminating the profiled flexible display panel to the protective cover plate 200, the fixture 10 is driven to move toward the first bendable portion 202 of the protective cover plate 200, after the profiled flexible display panel is in contact with the inner surface of the first bendable portion 202 of the protective cover plate 200, the fixture is continued to be driven, and the first curved wrapping portion 122 is squeezed, so that a portion of the profiled flexible display panel covering the first curved wrapping portion 122 may be in full contact with the first bendable portion 202 of the protective cover plate 200, which is conducive to avoiding a situation that the profiled flexible display panel and the first bendable portion 202 of the protective cover plate 200 that are laminated still have a gap therebetween.

In some embodiments, the thickness A of the first wrapping portion 121 may be one third of the thickness b of the first curved wrapping portion 122. In some other embodiments, the thickness c of the second wrapping portion 123 may be one third of the thickness b of the first curved wrapping portion 122. In yet some other embodiments, the thickness A of the first wrapping portion 121 and the thickness c of the second wrapping portion 123 may each be one third of the thickness b of the first curved wrapping portion 122.

For example, the thickness A of the first wrapping portion 121 may be approximately 1 mm, the thickness c of the second wrapping portion 123 may be approximately 1 mm, and the thickness b of the first curved wrapping portion 122 may be approximately 3 mm.

In this way, it may be possible to prevent the thickness b of the first curved wrapping portion 122 from being too small, and avoid a situation that the squeezed first curved wrapping portion 122 is unable to make the flexible display panel in full contact with the first bendable portion 202 of the protective cover plate 200 in the process of laminating the profiled flexible display panel to the protective cover plate 200, and the profiled flexible display panel and the first bendable portion 202 of the protective cover plate 200 that are laminated still have a gap therebetween. In addition, it may be possible to prevent the thickness b of the first curved wrapping portion 122 from being too large, and avoid a situation that the first curved wrapping portion 122 is offset upward or downward after the profiled flexible display panel is aligned with the protective cover plate 200 and before the profiled flexible display panel is laminated to the protective cover plate 200, which results in the failure of the subsequent laminating process.

In some embodiments, as shown in FIG. 6, the flexible wrapping structure 12 further includes a second curved wrapping portion 124 connected to an end of the second wrapping portion 123 away from the first curved wrapping portion 122. The second curved wrapping portion 124 covers at least part of the second end surface 1114.

The description "the second curved wrapping portion 124 covers at least part of the second end surface 1114" may, for example, have the following situations: the second curved wrapping portion 124 covers part of the second end surface 1114; alternatively, the second curved wrapping portion 124 covers the entire second end surface 1114.

For example, the second curved wrapping portion 124 not only covers the second end surface 1114, but also covers part of the second supporting portion 112.

In this way, referring to FIG. 3, in a case where the protective cover plate 200 further includes a second bendable portion 204 connected to an end of the second portion 203 away from the first bendable portion 202, the fixture 10 is driven to move, and the profiled flexible display panel may be laminated to the second bendable portion 204. Thus, a position of the display module corresponding to the second bendable portion 204 may realize a display function, and a screen-to-body ratio of the display device that adopts the display module is improved.

In some embodiments, as shown in FIG. 5, the second support portion 112 is further provided therein with a plurality of positioning holes 1122. The plurality of positioning holes 1122 are located on a side of the plane S where the first main surface 101 is located away from the first support portion 111.

For example, the plurality of positioning holes 1122 may be used for fixing the second support portion 112 and the first driving assembly 30.

It will be noted that, the shape, size, number and arrangement manner of the positioning holes 1122 are not limited in the present disclosure, as long as it can be ensured that the fixture 10 can move steadily in a case where the first driving assembly 30 is fixed to the second support portion 112 through the positioning holes 1122.

In some embodiments, as shown in FIG. 6, the second support portion 112 is connected to a portion of the first support surface 1111 proximate to the second end surface 1114.

In this way, an area of a portion of the first support surface 1111 that is covered by the carrier film 20 is large, an area of the flexible display panel carried on the carrier film 20 is large, and a length of the flexible display panel in the first direction X is large, which is conducive to realizing a wraparound large-screen display.

In some embodiments, as shown in FIG. 7, the fixture 10 includes a first extending portion 13 and a second extending portion 14. The first extending portion 13 extends in the first direction X, and the first extending portion 13 includes a first extending surface 131, a first curved extending surface 132 and a second extending surface 133 that are connected in sequence. The first extending surface 131 is the first main surface 101, the first curved extending surface 132 is the curved transition surface 102, and the second extending surface 133 is the second main surface 103. The second extending portion 14 is connected to the first extending surface 131, and extends in the second direction Y intersecting the first direction X.

The first extending portion 13 is configured to generate magnetic attraction force after being energized, and the carrier film 20 is configured to be attracted by the magnetic attraction force generated by the first extending portion 13.

For example, the carrier film 20 may be made of martensitic stainless steel or ferritic stainless steel. Alternatively, the carrier film 20 may be made of other materials that can be attracted by the magnetic attraction force, and the material of the carrier film in the embodiments of the present disclosure is not limited thereto.

For example, a thickness of the carrier film 20 may be in a range from approximately 15 μm to approximately 150 μm.

Therefore, by using the fixture 10 and the carrier film 20 provided in the embodiments of the preset disclosure, in the process of profiling the flexible display panel, the flexible display panel may be first placed on the surface of the carrier film 20, then the first extending portion is energized, and the first extending portion 13 is directly attract the carrier film 20, thereby avoiding a situation that the carrier film 20 is warped. Furthermore, in this way, it may also be possible to avoid that the carrier film 20 is warped in the process of aligning the profiled flexible display panel with the protective cover plate, which causes a situation that the profiled flexible display panel is unable to be aligned with the protective cover plate 200 (for example, the flexible display panel is unable to enter a space formed by the first portion 201 and the second portion 203 of the protective cover plate 200), or a situation that the profiled flexible display panel is in contact with the protective cover plate 200 in advance after the profiled display panel is aligned with the protective cover plate 200.

Based on this, by using the profiling and laminating device provided in the embodiments of the present disclosure, it may be possible to effectively improve the profiling effect of the flexible display panel, improve the profiling quality of the profiled flexible display panel and the protective cover plate, and improve the yield of the display module manufactured by the profiling and laminating device provided in the embodiments of the present disclosure.

In some embodiments, as shown in FIG. 7, the first extending portion 13 includes a plurality of electromagnetic coils 134 and an extending body 135 that extends in the first direction X A surface of the extending body 135 has a plurality of grooves 1351, and at least one electromagnetic coil 134 is disposed in a groove 1351.

The shape and number of turns of the electromagnetic coil are not limited in the present disclosure, as long as the electromagnetic coil 134 can generate an electromagnetic force after being energized.

For example, in a case where at least one electromagnetic coil 134 is disposed in the groove 1351, an upper surface of the at least one electromagnetic coil 134 as a whole is flush with a surface of the extending body 135.

The description "at least one electromagnetic coil 134 is disposed in a groove 1351" means that, one electromagnetic coil 134 may be provided in the groove 1351, or multiple electromagnetic coils may be disposed in the groove 1351. The number of electromagnetic coils 134 in one groove 1351 is not limited in the present disclosure, as long as the carrier film 20 can be attracted at a position where the groove 1351 is located.

In this way, when the plurality of electromagnetic coils 134 of the first extending portion 13 are energized, the plurality of electromagnetic coils 134 may each generate electromagnetic force to attract the carrier film 20. Therefore, it may be possible to avoid a problem that the carrier film is warped, and in turn improve the profiling effect of the flexible display panel in the process of profiling the flexible display panel. In the process of aligning the profiled flexible display panel with the protective cover plate 200 and in the process of laminating the profiled flexible display panel to the protective cover plate, a situation that the profiled display panel is in contact with the protective cover plate in advance is avoided, and the alignment accuracy and lamination effect are improved.

In some embodiments, electromagnetic coils 134 in each groove 1351 may be controlled separately. That is, the electromagnetic coils 134 in each groove 1351 may generate magnetic attraction force at different times. In this way, at a certain time, a part of the electromagnetic coils may attract the carrier film, and another part of the electromagnetic coils may not attract the carrier film, thereby reducing the power consumption.

In some other embodiments, the plurality of electromagnetic coils 134 may be controlled in zones. For example, electromagnetic coils 134 proximate to the first extending surface 131 may be controlled together. That is, all electromagnetic coils 134 proximate to the first extending surface 131 may be energized at a same time, or may be deenergized at a same time; that is, all electromagnetic coils 134 proximate to the first extending surface 131 may generate electromagnetic force at a same time, or may not generate electromagnetic force at a same time.

Similarly, all electromagnetic coils 134 proximate to the first curved extending surface 132 may be energized at a same time, or may be deenergized at a same time. All electromagnetic coils 134 proximate to the second extending surface 133 may be energized at a same time, or may be deenergized at a same time.

In some embodiments of the present disclosure, as shown in FIGS. 7 and 8, the number of electromagnetic coils 134 proximate to the first extending surface 131 is less than the number of electromagnetic coils 134 proximate to the second extending surface 133.

In a case where the shape of the protective cover plate 200 is the shape shown in FIG. 3, that is, in a case where the length of the first portion 201 in the first direction X is less than the length of the second portion 203 in the first direction X, a length of a portion of the carrier film 20 (or the profiled flexible display panel) that covers the first main surface 101 is less than a length of a portion of the carrier film 20 (or the profiled flexible display panel) that covers the second main surface 103. Based on this, the number of electromagnetic coils 134 proximate to the first extending surface 131 is less than the number of electromagnetic coils 134 proximate to the second extending surface 133, which may reduce the number of electromagnetic coils 134 in the fixture 10 and reduce the cost of the fixture 10.

In a case where the shape of the protective cover plate is the shape shown in FIG. 9, that is, in a case where the length of the first portion 201 in the first direction X is equal to the length of the second portion 203 in the first direction X, the number of electromagnetic coils 134 proximate to the first extending surface 131 is less than the number of electromagnetic coils 134 proximate to the second extending surface 133. Thus, it may be convenient to firstly laminate the first portion 201 to a portion of the profiled flexible display panel covering the first main surface 101 when laminating the profiled flexible display panel to the protective cover plate 200.

Figure 10:
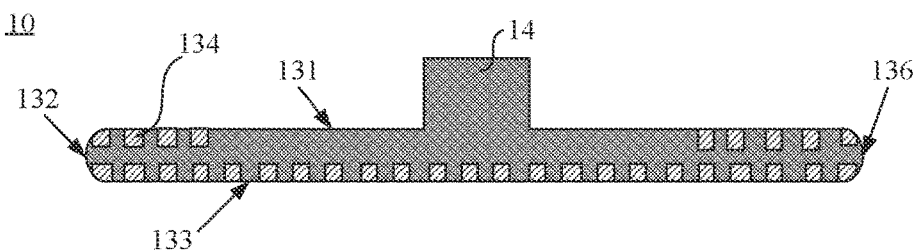
FIG. 10 is a structural diagram of yet another fixture, in accordance with some embodiments.

In some embodiments, as shown in FIGS. 7 and 10, the first extending portion 13 further includes a second curved extending surface 136 that connects the first extending surface 131 and the second extending surface 133.

In this way, in a case where the protective cover plate 200 has the structure shown in FIG. 3 (that is, the protective cover plate 200 includes the first portion 201, the first bendable portion 202, the second portion 203 and the second bendable portion 204 that are connected in sequence), the flexible display panel may be profiled by using the second curved extending surface 136, so that the profiled flexible display panel may be laminated to the second bendable portion 204.

Figure 11:
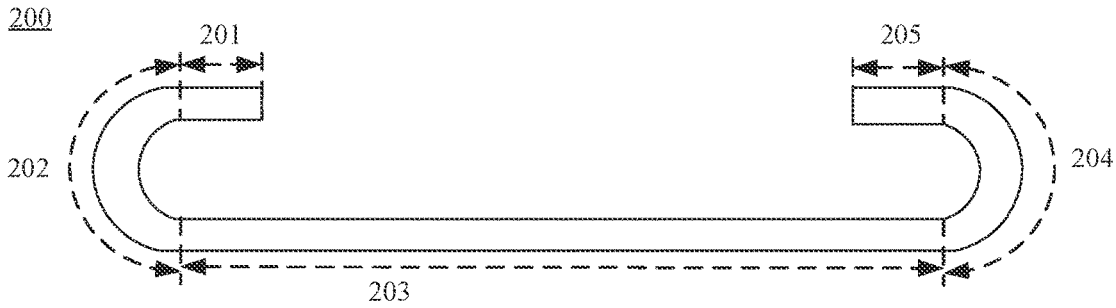
FIG. 11 is a structural diagram of yet another protective cover plate, in accordance with some embodiments.

In a case where the protective cover plate 200 has the structure shown in FIG. 11 (that is, the protective cover plate 200 includes the first portion 201, the first bendable portion 202, the second portion 203, the second bendable portion 204 and a third portion 205 that are connected in sequence), the flexible display panel may be profiled by using the second curved extending surface 136, so that the profiled flexible display panel may be laminated to the second bendable portion 204 and the third portion 205.

In some embodiments, as shown in FIG. 7, the second extending portion 14 is connected to an edge portion of the first extending surface 131 that is connected to the second curved extending surface 136, a surface of the second extending portion 14 is smoothly connected to the second curved extending surface 136, and at least one electromagnetic coil 134 is embedded in a surface of the second extending portion 14 proximate to the second curved extending surface 136.

The description "at least one electromagnetic coil 134 is embedded in a surface of the second extending portion 14 proximate to the second curved extending surface 136" may, for example, have the following situations: one electromagnetic coil is embedded in the surface of the second extending portion 14 proximate to the second curved extending surface 136; alternatively, electromagnetic coils 134 in a row are embedded in the surface of the second extending portion 14 proximate to the second curved extending surface 136, and the electromagnetic coils 134 in the row each have a same distance to a boundary between the second curved extending surface 136 and the surface of the second extending portion 14.

The surface of the second extending portion 14 is smoothly connected to the second curved extending surface 136, that is, the surface of the second extending portion 14 and the second curved extending surface 136 are connected, and have no sharp corner therebetween.

Since the at least one electromagnetic coil 134 is embedded in the surface of the second extending portion 14 proximate to the second curved extending surface 136, the carrier film 20 may be attracted in a case where a height of the carrier film 20 in the second direction Y exceeds a height of the second curved extending surface 136 in the second direction Y, which avoids that a portion of the carrier film 20 corresponding to the second curved extending surface 136 is warped. Therefore, it may be possible to ensure the alignment accuracy and lamination effect of the profiled flexible display panel and the protective cover plate 200.

In some other embodiments, as shown in FIG. 10, the second extending portion 14 is connected to a middle portion of the first extending surface 131 in the first direction X. In a case where the first extending portion 13 includes the plurality of electromagnetic coils 134, in all electromagnetic coils 134 proximate to the first extending surface 131, the number of electromagnetic coils 134 located on one side of two opposite sides of the first extending portion 13 and the number of electromagnetic coils 134 located on the other side of the two opposite sides are different.

In this way, in a case where the protective cover plate 200 has the structure shown in FIG. 11, by using the fixture 10 and the carrier film 20, the flexible display panel may cover the first portion 201, the first bendable portion 202, the second portion 203, the second bendable portion 204 and the third portion 205 of the protective cover plate 200. Therefore, the display device that adopts the display module manufactured by using the profiling and laminating device provided in the embodiments of the present disclosure may realize both double-sided display and double-edge-side display.

In addition, in the embodiments of the present disclosure, since the numbers of electromagnetic coils 134 of all electromagnetic coils 134 proximate to the first extending surface 131 that are located on the two opposite sides of the first extending portion 13 are different, it may be convenient to first laminate the flexible display panel to the first portion 201 or the third portion 205 of the protective cover plate 200 in the process of laminating the profiled flexible display panel to the protective cover plate.

Figure 12:
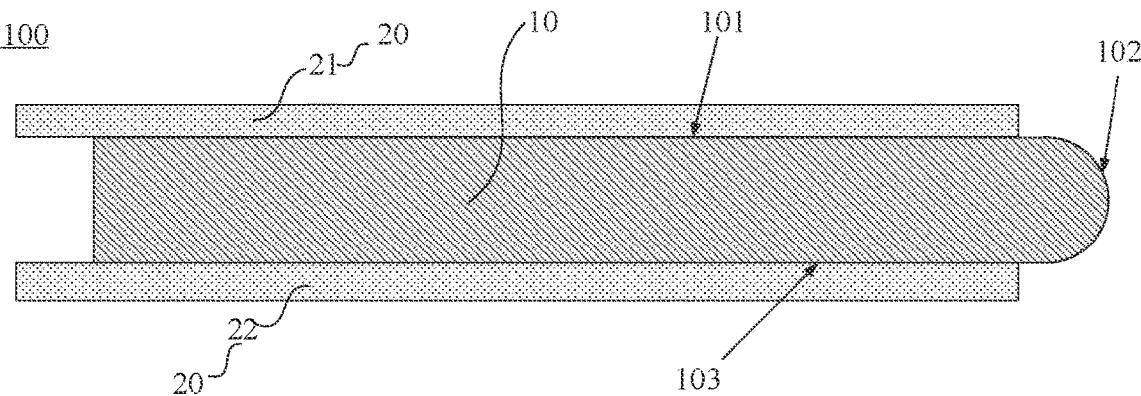
FIG. 12 is a structural diagram of yet another profiling and laminating device, in accordance with some embodiments.

In some embodiments, as shown in FIGS. 2 and 12, the carrier film 20 includes a first carrier portion 21 and a second carrier portion 22. The first carrier portion 21 is configured to cover the first main surface 101 under the driving of the second driving assembly 40. The second carrier portion 22 is configured to cover the second main surface 103 under the driving of the second driving assembly 40.

For example, the first carrier portion 21 and the second carrier portion 22 may be made of a same material, such as any of polyethylene terephthalate (PET), polyolefin (PO) or polyurethane (PU).

It will be noted that, the first carrier portion 21 covers the first main surface 101, the second carrier portion 22 covers the second main surface 103, that is, neither the first carrier portion 21 nor the second carrier portion 22 covers the curved transition portion 102. In this way, when the second driving assembly 40 does not drive the first carrier portion 21 and the second carrier portion 22 to move, there should be a distance between the first carrier portion 21 and the second carrier portion 22, and the distance may be greater than or equal to an arc length of the curved transition portion 102.

In this way, in the process of profiling the flexible display panel by using the fixture 10 and the carrier film 20, a portion of the carrier film 20 corresponding to the curved transition surface 102 does not need to be bent, only a portion of the flexible display panel corresponding to the curved transition surface 102 is bent, the warp degree of the flexible display panel is small, and the flexible display panel is close to the fixture 10 in a great extent. In this way, it is convenient to align the profiled flexible display panel with the protective cover plate, so that the flexible display panel may smoothly enter the space formed by the first portion 201 and the second portion 203. In addition, it may be possible to improve the alignment accuracy of the profiled flexible display panel and the protective cover plate, and the lamination effect of the profiled flexible display panel and the protective cover plate.

In the embodiments of the present disclosure, by using the carrier film with the segmented structure to profile the flexible display panel, it may be possible to improve the profiling accuracy of the flexible display panel, and in turn improve the alignment accuracy of the profiled flexible display panel and the protective cover plate, and the lamination effect of the profiled flexible display panel and the protective cover plate.

Figure 13A:
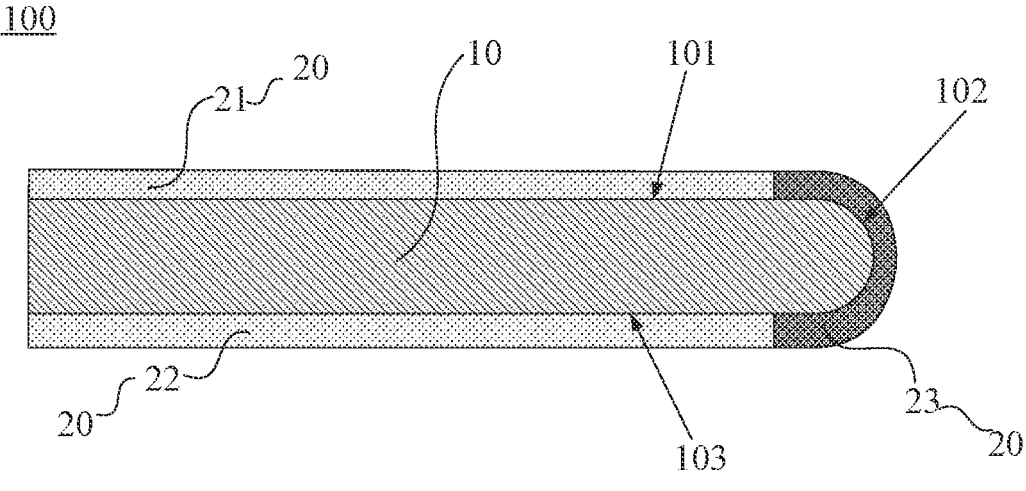
FIG. 13A is a structural diagram of yet another profiling and laminating device, in accordance with some embodiments.

In some embodiments, as shown in FIG. 13A, the profiling and laminating device 100 further includes a filling portion 23 that connects the first carrier portion 21 and the second carrier portion 22. An elastic modulus of the filling portion 23 is lower than an elastic modulus of the first carrier portion 21. Alternatively, the elastic modulus of the filling portion 23 is lower than an elastic modulus of the second carrier portion 22. Alternatively, the elastic modulus of the filling portion 23 is lower than both the elastic modulus of the first carrier portion 21 and the elastic modulus of the second carrier portion 22.

For example, the filling portion 23 is an organic thin film or an ultraviolet curing glue (which may be cured under the irradiation of ultraviolet light).

In this way, the warp of the portion of the carrier film 20 corresponding to the curved transition surface 102 is small, and the profiled flexible display panel is close to the fixture 10. Therefore, it is convenient to align the profiled flexible display panel with the protective cover plate 200, so that the flexible display panel may smoothly enter the space formed by the first portion 201 and the second portion 203. In addition, it may be possible to improve the alignment accuracy of the profiled flexible display panel and the protective cover plate, and the lamination effect of the profiled flexible display panel and the protective cover plate.

Furthermore, in this way, there will be no gap between the profiled flexible display panel and the fixture 10. In the process of laminating the profiled flexible display panel to the protective cover plate, it may be possible to avoid a situation that the profiled flexible display panel is unable to be fully in contact with the first bendable portion 202 due to the gap between the fixture 10 and the profiled flexible display panel.

In some embodiments, the elastic modulus of the carrier film 20 is in a range from 3.8 Gpa to 9.9 Gpa, inclusive. In this way, the warp of the carrier film 20 is small when the carrier film carries the flexible display panel for profiling, and the profiled flexible display panel may be close to the fixture 10 in a great extent. In this way, it is convenient to align the profiled flexible display panel with the protective cover plate 200; in addition, it may also be possible to improve the alignment accuracy of the profiled flexible display panel and the protective cover plate, and the lamination effect of the profiled flexible display panel to the protective cover plate.

Figure 13B:
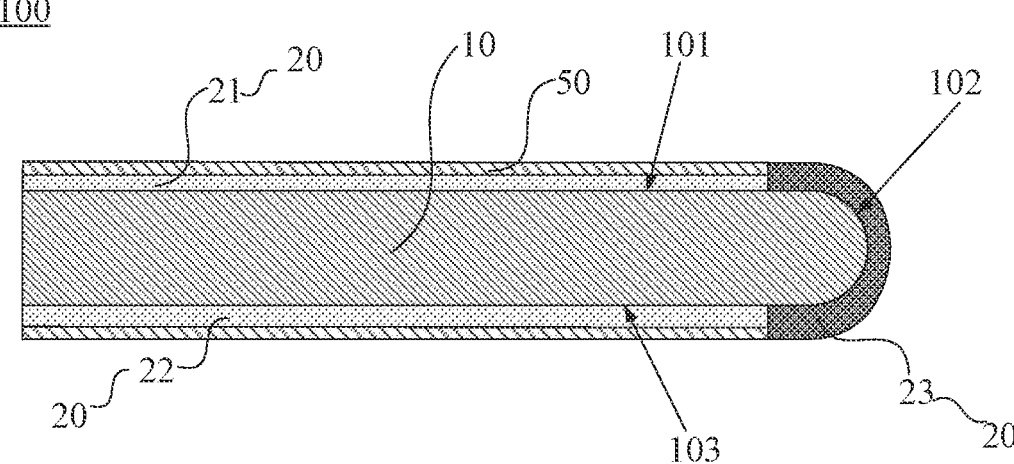
FIG. 13B is a structural diagram of yet another profiling and laminating device, in accordance with some embodiments.

In some embodiments, as shown in FIG. 13B, the profiling and laminating device 100 further includes an optical adhesive layer 50 located on a surface of the carrier film 20 that is used for carrying the flexible display panel. An elastic modulus of the optical adhesive layer 50 is in a range from 20 Gpa to 110 Gpa, inclusive.

By using the optical adhesive layer 50 whose elastic modulus is in a range from 20 Gpa to 110 Gpa inclusive, in the process of profiling the flexible display panel, the optical adhesive layer 50 is subjected to a force from the carrier film 20, and transmit the force to a surface of the flexible display panel proximate to the carrier film 20, which is conducive to reduce the warp height of the profiled flexible display panel. Thus, the profiled flexible display panel is close to the fixture 10 in a great extent.

Figure 14:
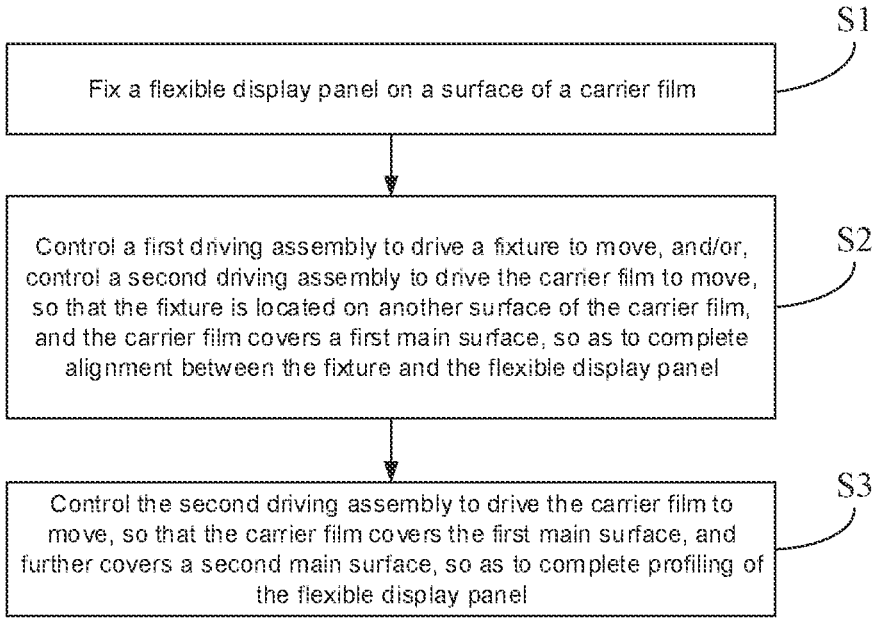
FIG. 14 is a flow diagram of a profiling and laminating method, in accordance with some embodiments.
Figure 15:
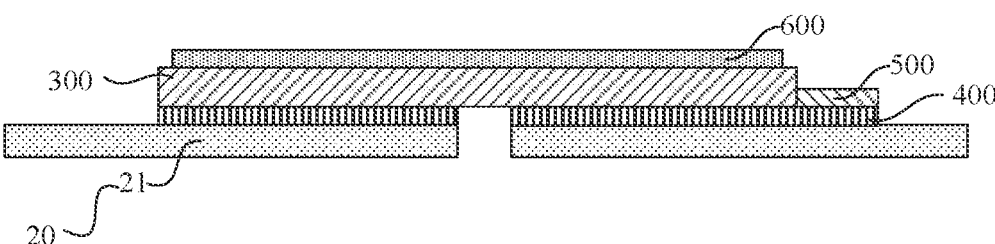
FIG. 15 is a diagram showing a state in which a flexible display panel is fixed on a support film, in accordance with some embodiments.
Figure 16:
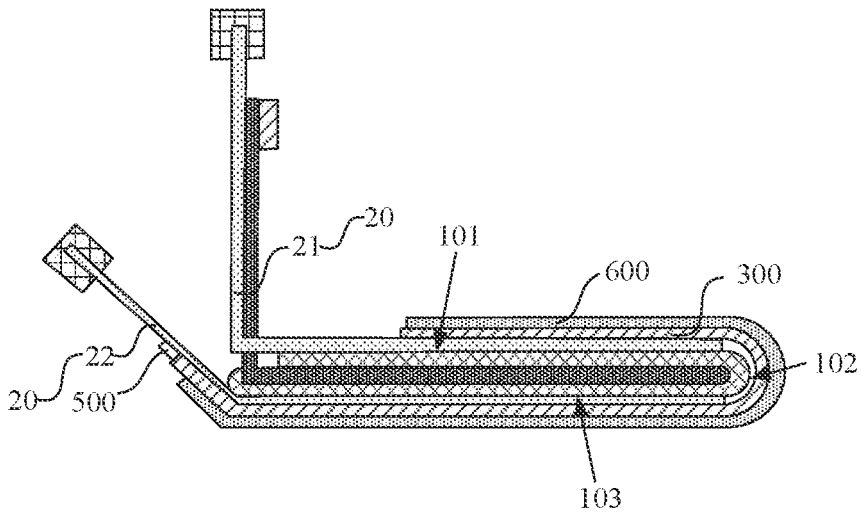
FIG. 16 is a diagram showing a state in which a flexible display panel is profiled by using a profiling and laminating device, in accordance with some embodiments.

Some embodiments of the present disclosure further provide a profiling and laminating method, which is applied to the profiling and laminating device as described in any one of the above embodiments. As shown in FIGS. 14, 15 and 16, the profiling and laminating method includes the followings.

In S1, a flexible display panel 300 is fixed on a surface of the carrier film 20 (as shown in FIG. 15).

In S2, the first driving assembly 30 is controlled to drive the fixture 10 to move, and/or, the second driving assembly 40 is controlled to drive the carrier film 20 to move, so that the fixture 10 is located on the another surface of the carrier film 20, and the carrier film 20 covers the first main surface 101, so as to complete the alignment between the fixture 10 and the flexible display panel 300.

In S3, the second driving assembly 40 is controlled to drive the carrier film 20 to move, so that the carrier film 20 covers the first main surface 101, and further covers the second main surface 103, so as to complete the profiling of the flexible display panel 300 (as shown in FIG. 16).

For example, as shown in FIG. 15, the flexible display panel 300 is fixed on the surface of the carrier film 20, which means that an optical viscosity-reducing adhesive 400 may be used to fix the flexible display panel 300 on the surface of the carrier film 20.

For example, as shown in FIG. 15, before the flexible display panel 300 is fixed on the surface of the carrier film 20, a flexible circuit board 500 may be bonded to the flexible display panel 300, and the flexible circuit board 500 is used for connecting the flexible display panel 300 to a control board. Alternatively, before the flexible display panel 300 is fixed on the surface of the carrier film 20, an adhesive layer 600 may be provided on a surface of the flexible display panel 300 away from the carrier film 20, and the adhesive layer 600 may be used to adhere the flexible display panel to the protective cover plate.

For example, a material of the adhesive layer 600 may be any one of optically clear adhesive (OCA), pressure sensitive adhesive, hot melt adhesive or water-based adhesive. The material of the adhesive layer 600 in the embodiments of the present disclosure is not limited thereto, as long as the adhesive layer 600 may be easily defoamed and cured after the profiled flexible display panel 300 is laminated to the protective cover plate 200.

It will be noted that, FIG. 15 shows an example in which the carrier film 20 includes the first carrier portion 21 and the second carrier portion 22, and the carrier film 20 in the embodiments of the present disclosure may also have other structures in any one of the above embodiments.

By using the profiling and laminating method provided in the embodiments of the present disclosure, the flexible display panel 300 may cover at least the first main surface 101 and the second main surface 103 of the fixture 10, and the profiled flexible display panel may be a wraparound flexible display panel. Therefore, the display device that adopts the profiled flexible display panel may realize double-sided display and edge-side display, and the screen-to-body ratio of the display device that adopts the profiled flexible display panel is increased.

In some embodiments, as shown in FIG. 17, the profiling and laminating method further includes the followings.

In S4, a protective cover plate 200 is provided, the protective cover plate 200 includes a first portion 201, a first bendable portion 202 and a second portion 203 that are connected in sequence, and the second portion 203 is disposed opposite to the first portion 201 (as shown in FIG. 3).

In S5, the first driving assembly 30 is controlled to drive the fixture 10 to move, and the second driving assembly 40 is controlled to drive the carrier film 20 to move at the same time, so that the profiled flexible display panel 300 and the fixture 10 are located on an inner side of the protective cover plate 200 as a whole (as shown in FIG. 18).

In some embodiments, as shown in FIG. 19, the fixture 10 includes a support structure 11 and a flexible wrapping structure 12, and the profiling and laminating method further includes the followings.

Figure 20:
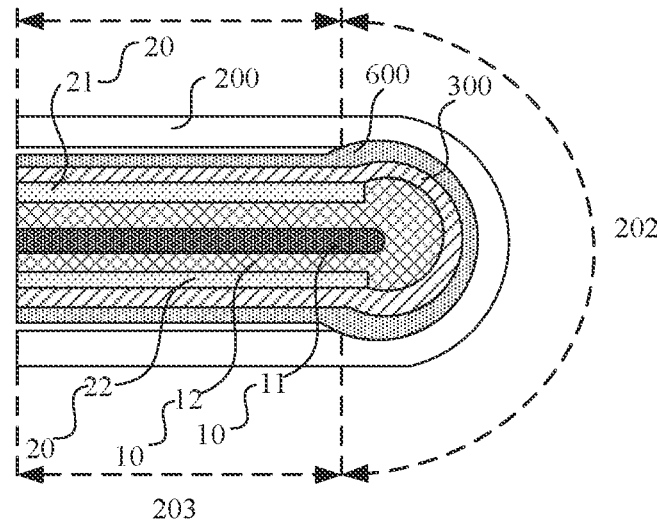
FIG. 20 is a diagram showing a state in which a flexible display panel is laminated to a protective cover plate, in accordance with some embodiments.

In S6, the first driving assembly 30 is controlled to drive the support structure 11 of the fixture 10 to move toward the first bendable portion 202, and the second driving assembly 40 is controlled to reduce a tension force applied on the carrier film 20 at the same time, so that a portion of the flexible display panel 300 is laminated to the first bendable portion 202 (as shown in FIG. 20).

Figure 21:
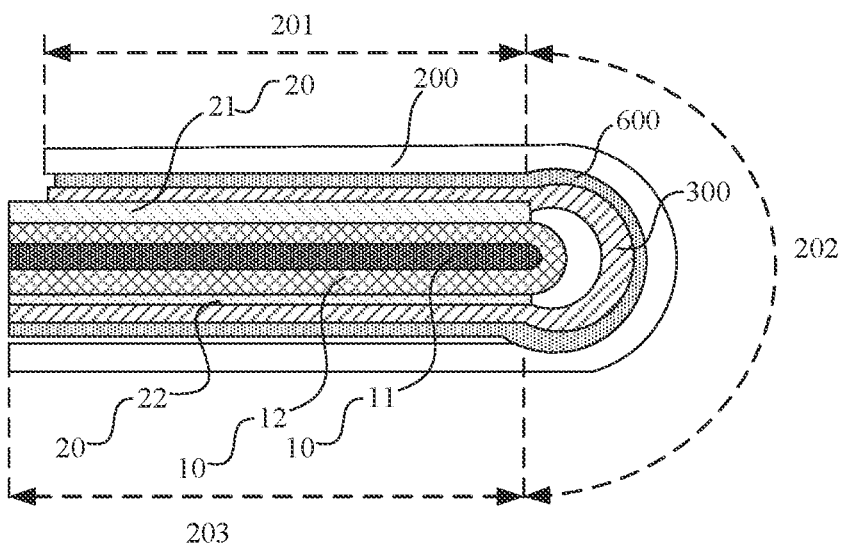
FIG. 21 is a diagram showing a state in which a flexible display panel is laminated to a protective cover plate, in accordance with some other embodiments.

In S7, the first driving assembly 30 is controlled to drive the support structure 11 of the fixture 10 to move toward the first portion 201, and the second driving assembly 40 is controlled to reduce the tension force applied on the carrier film 20 at the same time, so that another portion of the flexible display panel 300 is laminated to the first portion 201 (as shown in FIG. 21).

Figure 22:
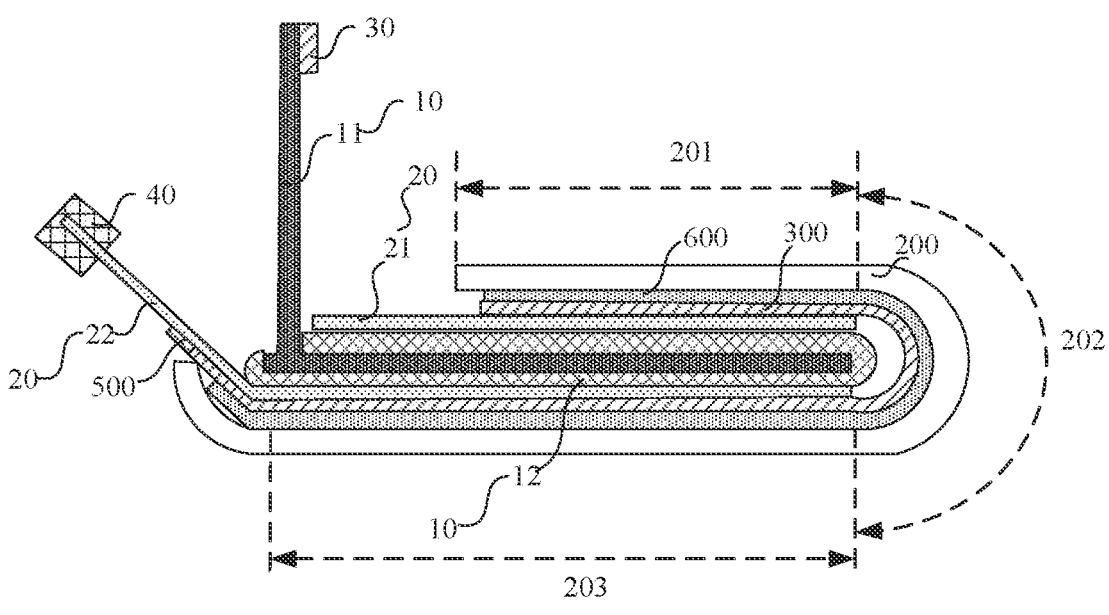
FIG. 22 is a diagram showing a state in which a flexible display panel is laminated to a protective cover plate, in accordance with yet some other embodiments.

In S8, the first driving assembly 30 is controlled to drive the support structure 11 of the fixture 10 to move toward the second portion 203, and the second driving assembly 40 is controlled to reduce the tension force applied on the carrier film 20 at the same time, so that yet another portion of the flexible display panel 300 is laminated to the second portion 203 (as shown in FIG. 22).

It is worth noting that, in order to make the portion of the profiled flexible display panel fully bonded to the first bendable portion 202 of the protective cover plate 200, after the portion of the profiled flexible display panel is bonded to the first bendable portion 202, the support structure 11 may stop moving for a period of time, then the support structure 11 is driven to move again. For example, the support structure 11 may stop moving for about 30 seconds.

Similarly, in order to make the another portion of the profiled flexible display panel fully bonded to the first portion 201 of the protective cover plate 200, after the another portion of the profiled flexible display panel is bonded to the first portion 201, the support structure 11 may stop moving for a period of time, then the support structure 11 is driven to move again. For example, the support structure 11 may stop moving for about 30 seconds.

Similarly, in order to make the yet another portion of the profiled flexible display panel fully bonded to the second portion 203 of the protective cover plate 200, after the yet another portion of the profiled flexible display panel is bonded to the second portion 203, the support structure 11 may stop moving for a period of time, then the support structure 11 is driven to move again (for example, the support structure 11 is driven to move away from the second portion 203). For example, the support structure 11 may stop moving for about 30 seconds.

Figure 23:
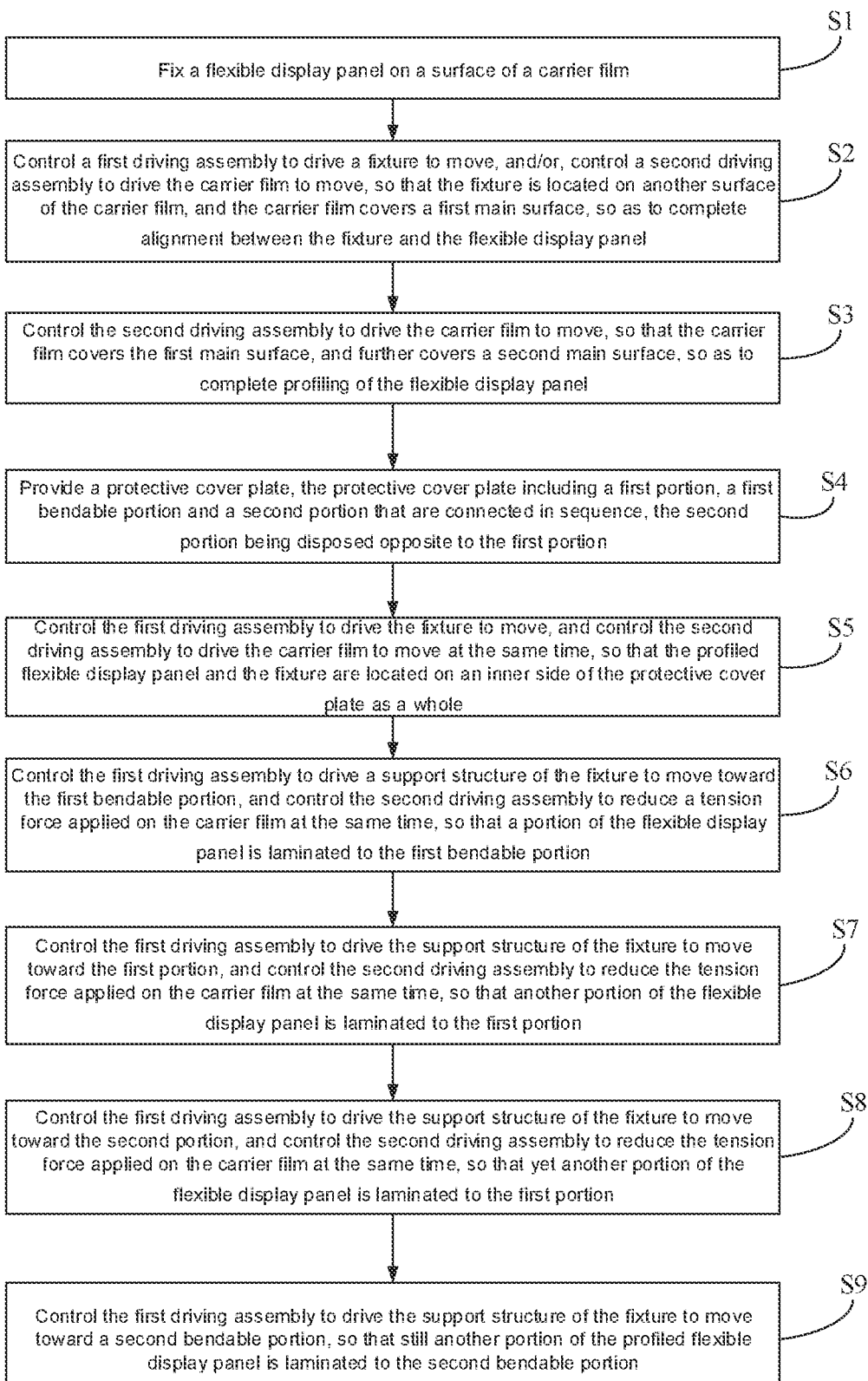
FIG. 23 is a flow diagram of yet another profiling and laminating method, in accordance with some embodiments.

In some embodiments, as shown in FIG. 23, the flexible wrapping structure 12 further includes a second curved wrapping portion 124, and the protective cover plate 200 further includes a second bendable portion 204 connected to an end of the second portion 203 away from the first bendable portion 202; after the yet another portion of the profiled flexible display panel is laminated to the second portion 203, the profiling and laminating method further includes the followings.

Figure 24:
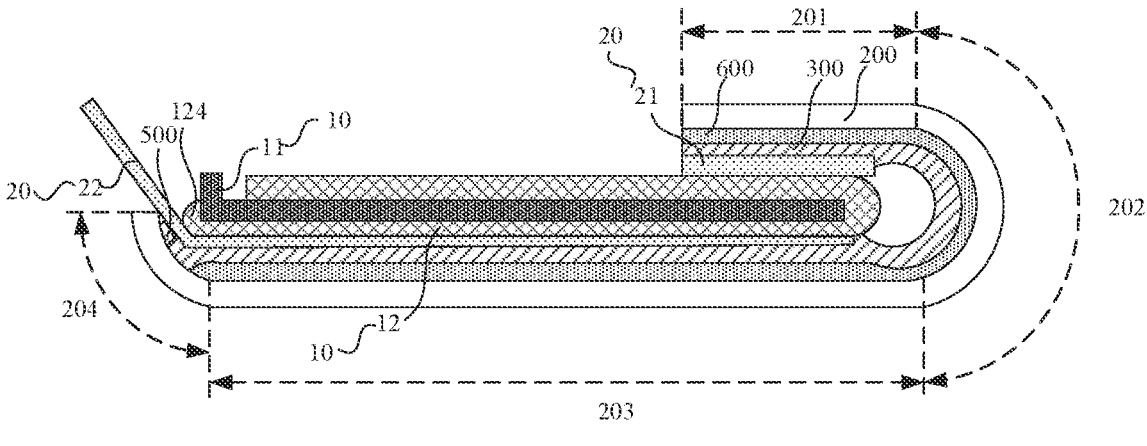
FIG. 24 is a diagram showing a state in which a flexible display panel is laminated to a protective cover plate, in accordance with yet some other embodiments.

In S9, the first driving assembly 30 is controlled to drive the support structure 11 of the fixture 10 to move toward the second bendable portion 204, so that still another portion of the profiled flexible display panel is laminated to the second bendable portion 204 (as shown in FIG. 24).

In order to make the still another portion of the profiled flexible display panel fully bonded to the second bendable portion 204 of the protective cover plate 200, after the still another portion of the flexible display panel 300 is bonded to the second bendable portion 204, the support structure 11 may stop moving for a period of time, then the support structure 11 is driven to move again (for example, the support structure 11 is driven to move away from the second bendable portion 204). For example, the support structure 11 may stop moving for about 30 seconds.

In some other embodiments, as shown in FIG. 25, in a case where the fixture 10 includes the first extending portion 13 and the second extending portion 14, the profiling and laminating method further includes the followings.

In S6', the first driving assembly 30 is controlled to drive the fixture 10 to move, and the second driving assembly 40 is controlled to drive the carrier film 20 to move, so that the first extending portion 13 drives the carrier film 20 to move toward the first portion 201, and a portion of the flexible display panel 300 is laminated to the first portion 201.

In S7', magnetic attraction forces at different positions of the first extending portion 13 are adjusted, the first driving assembly 30 is controlled to drive the fixture 10 to move, and the second driving assembly 40 is controlled to drive the carrier film 20 to move, so that the first extending portion 13 drives the carrier film 20 to move toward the first bendable portion 202 and the second portion 203 in sequence, and another portion of the flexible display panel 300 is laminated to the first bendable portion 202 and the second portion 203 in sequence.

The magnetic attraction forces at different positions of the first extending portion 13 may be adjusted, for example, operating currents in electromagnetic coils 134 may be adjusted to control the magnetic attraction forces at different positions of the first extending portion 13.

For example, the magnetic attraction forces at different positions of the first extending portion 13 may be adjusted to reduce the magnetic attraction force of the first extending portion 13, so that the first extending portion 13 and the carrier film 20 may move relative to each other.

Figure 26:
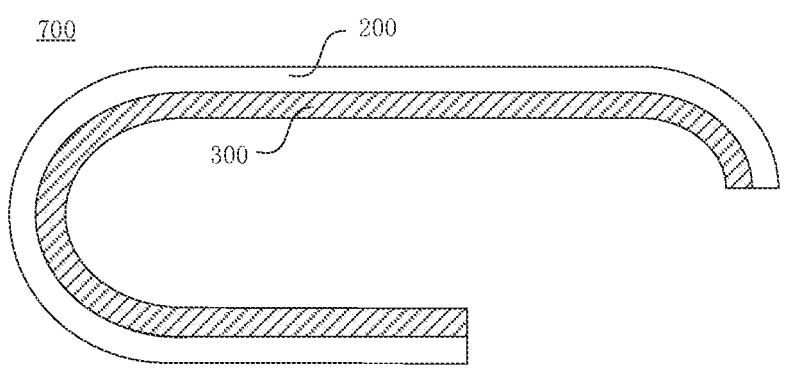
FIG. 26 is a structural diagram of a display module, in accordance with some embodiments.

As shown in FIG. 26, some embodiments of the present disclosure provide a display module 700, and the display module 700 is manufactured by the profiling and laminating method as described in any one of the above embodiments. For example, the display module 700 may include the profiled flexible display panel 300 provided in any one of the above embodiments and a protective cover plate 200.

Since the display module 700 provided in the embodiments of the present disclosure includes the profiled flexible display panel 300 provided in any one of the above embodiments and the protective cover plate 200, the display module 700 may realize double-sided display and edge-side display. Therefore, the display device that adopts the display module 700 has a high screen-to-body ratio, and the display effect of the display device that adopts the display module 700 is improved.

Figure 27A:
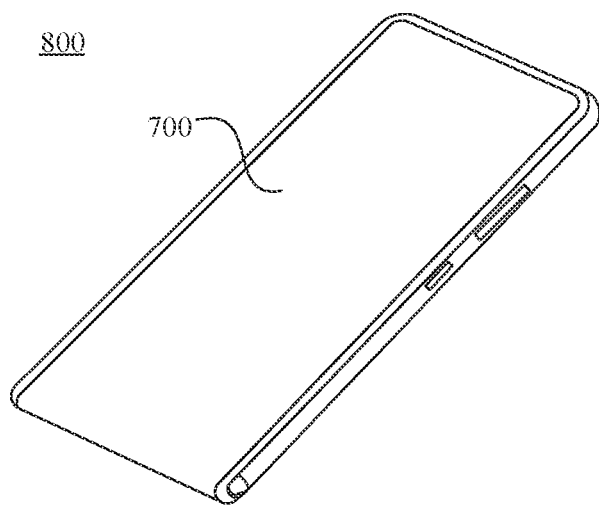
FIG. 27A is a diagram showing a front of a display device, in accordance with some embodiments.
Figure 27B:
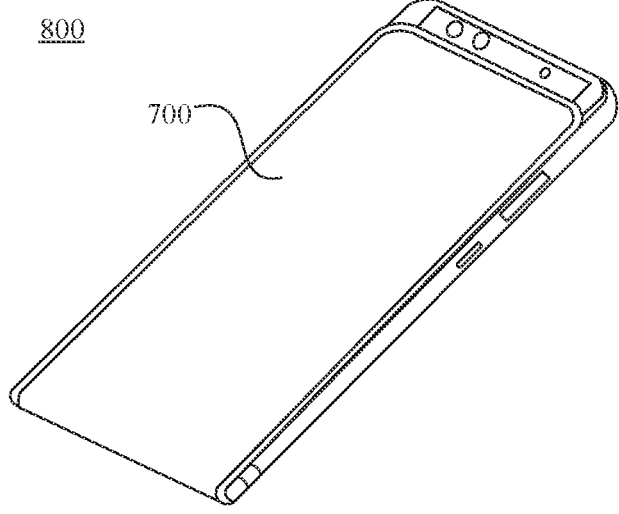
FIG. 27B is a diagram showing a back of a display device, in accordance with some embodiments.

As shown in FIGS. 27A and 27B, some embodiments of the disclosure provide a display device 800 including the display module 700 provided in any one of the above embodiments.

For example, as shown in FIGS. 27A and 27B, the display device 800 is a wraparound display device that displays images on front and back sides thereof; alternatively, for example, the display device 800 is a wraparound display device that displays images on left and right sides thereof, which is not limited in the present disclosure.

The display device may be any component with a display function, such as a television, a digital camera, a mobile phone, a watch, a tablet computer, a notebook computer, or a navigator. Beneficial effects achieved by the display device 800 provided in the embodiments of the present disclosure are the same as the beneficial effects achieved by the display module 700 provided in the above technical solutions, and details will not be repeated here.

Some embodiments of the present disclosure provide a computer device including a memory and a processor. The memory stores therein a computer program that is executable on the processor. The processor executes the computer program to cause the computer device to implement one or more steps of the profiling and laminating method as described above.

Some embodiments of the present disclosure provide a computer-readable storage medium (e.g., a non-transitory computer-readable storage medium). The computer-readable storage medium stores computer program instructions that, when run on a processor, cause the processor to perform one or more steps of the profiling and laminating method as described in any one of the above embodiments.

For example, the computer-readable storage medium may include, but is not limited to: a magnetic storage device (e.g., a hard disk, a floppy disk, or a magnetic tape), an optical disk (e.g., a compact disk (CD)), a digital versatile disk (DVD), a smart card and a flash memory device (e.g., an erasable programmable read-only memory (EPROM), a card, a stick or a key driver). The various computer-readable storage media described in the embodiments of the present disclosure may represent one or more devices and/or other machine-readable storage media for storing information. The term "machine-readable storage media" may include, but is not limited to, wireless channels and various other media capable of storing, containing, and/or carrying instruction(s) and/or data.

Some embodiments of the present disclosure further provide a computer program product. The computer program product includes computer program instructions that, when executed on a computer, cause the computer to perform one or more steps of the profiling and laminating method as described in the above embodiments.

Some embodiments of the present disclosure further provide a computer program. When executed by a computer, the computer program causes the computer to perform one or more steps of the profiling and laminating method as described in the above embodiments.

Beneficial effects of the computer device, the computer-readable storage medium, the computer program product, and the computer program are the same as the beneficial effects of the profiling and laminating method as described in the embodiments as described above, and details will not be repeated here.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A profiling and laminating device, comprising:
a fixture including a first main surface, a curved transition surface and a second main surface that are connected in sequence, wherein the first main surface and the second main surface are located on two opposite sides of the fixture, respectively;
a carrier film, wherein a surface of the carrier film is used for carrying a flexible display panel, and another surface of the carrier film is used for covering at least the first main surface and the second main surface of the fixture;
a first driving assembly, the first driving assembly being configured to drive the fixture to move; and
a second driving assembly, the second driving assembly being configured to drive the carrier film to move;
wherein the fixture includes:
a support structure, the support structure including:
a first support portion extending in a first direction, the first support portion including a first support surface, a first end surface, a second support surface and a second end surface that are connected end to end in sequence; and
a second support portion being connected to the first support surface and extending in a second direction intersecting the first direction; and
a flexible wrapping structure including a first wrapping portion, a first curved wrapping portion and a second wrapping portion that are connected in sequence, the first wrapping portion covering the first support surface, the first curved wrapping portion covering the first end surface, the second wrapping portion covering the second support surface;
wherein a surface of the first wrapping portion away from the first support surface is the first main surface, a surface of the first curved wrapping portion away from the first end surface is the curved transition surface, and a surface of the second wrapping portion away from the second support surface is the second main surface; or
a surface of the first wrapping portion away from the first support surface is the first main surface, a surface of the first curved wrapping portion away from the first end surface is the curved transition surface, a surface of the second wrapping portion away from the second support surface is the second main surface, the second support portion is provided therein with an opening penetrating the second support portion in the first direction, and the opening is located on a side, proximate to the first support portion, of a plane where the first main surface is located.

2. The profiling and laminating device according to claim 1, wherein
a thickness of the first wrapping portion is less than a thickness of the first curved wrapping portion; and/or
a thickness of the second wrapping portion is less than the thickness of the first curved wrapping portion.

3. The profiling and laminating device according to claim 2, wherein
the thickness of the first wrapping portion is one third of the thickness of the first curved wrapping portion; and/or
the thickness of the second wrapping portion is one third of the thickness of the first curved wrapping portion.

4. The profiling and laminating device according to claim 1, wherein
the flexible wrapping structure further includes a second curved wrapping portion connected to an end of the second wrapping portion away from the first curved wrapping portion;
the second curved wrapping portion covers at least part of the second end surface.

5. The profiling and laminating device according to claim 1, wherein the second support portion is further provided therein with a plurality of positioning holes, and the plurality of positioning holes are located on a side, away from the first support portion, of a plane where the first main surface is located; and/or
the second support portion is connected to a portion of the first support surface proximate to the second end surface.

6. The profiling and laminating device according to claim 1, wherein the carrier film includes:
a first carrier portion, the first carrier portion being configured to cover the first main surface under driving of the second driving assembly; and
a second carrier portion, the second carrier portion being configured to cover the second main surface under driving of the second driving assembly.

7. A profiling and laminating method, applied to the profiling and laminating device according to claim 1, comprising:
fixing the flexible display panel on the surface of the carrier film;
controlling the first driving assembly to drive the fixture to move, and/or, controlling the second driving assembly to drive the carrier film to move, so that the fixture is located on the another surface of the carrier film, and the carrier film covers the first main surface, so as to complete alignment between the fixture and the flexible display panel; and
controlling the second driving assembly to drive the carrier film to move, so that the carrier film covers the first main surface and the second main surface, so as to complete profiling of the flexible display panel.

8. The profiling and laminating method according to claim 7, further comprising:
providing a protective cover plate, the protective cover plate including a first portion, a first bendable portion and a second portion that are connected in sequence, the second portion being arranged opposite to the first portion; and
controlling the first driving assembly to drive the fixture to move, and at a same time controlling the second driving assembly to drive the carrier film to move, so that the profiled flexible display panel and the fixture are located on an inner side of the protective cover plate as a whole.

9. The profiling and laminating method according to claim 8, wherein the profiling and laminating method further comprises:

controlling the first driving assembly to drive the support structure of the fixture to move toward the first bendable portion, and at a same time controlling the second driving assembly to reduce a tension force applied on the carrier film, so that a portion of the flexible display panel is laminated to the first bendable portion;

controlling the first driving assembly to drive the support structure of the fixture to move toward the first portion, and at a same time controlling the second driving assembly to reduce the tension force applied on the carrier film, so that another portion of the flexible display panel is laminated to the first portion; and controlling the first driving assembly to drive the support structure of the fixture to move toward the second portion, and at a same time controlling the second driving assembly to reduce the tension force applied on the carrier film, so that yet another portion of the flexible display panel is laminated to the second portion.

10. The profiling and laminating method according to claim 9, wherein the flexible wrapping structure further includes a second curved wrapping portion, the protective cover plate includes a second bendable portion connected to an end of the second portion away from the first bendable portion; after the yet another portion of the flexible display panel is laminated to the second portion, the profiling and laminating method further comprises:

controlling the first driving assembly to drive the support structure of the fixture to move toward the second bendable portion, so that still another portion of the flexible display panel is laminated to the second bendable portion.

11. The profiling and laminating method according to claim 8, wherein the fixture includes a first extending portion and a second extending portion, and the profiling and laminating method further comprises:

controlling the first driving assembly to drive the fixture to move, and controlling the second driving assembly to drive the carrier film to move, so that the first extending portion drives the carrier film to move toward the first portion, and a portion of the flexible display panel is laminated to the first portion; and adjusting magnetic attraction forces at different positions of the first extending portion, controlling the first driving assembly to drive the fixture to move, and controlling the second driving assembly to drive the carrier film to move, so that the first extending portion drives the carrier film to move toward the first bendable portion and the second portion in sequence, and another portion of the flexible display panel is laminated to the first bendable portion and the second portion in sequence.

12. A display module, wherein the display module is manufactured by the profiling and laminating method according to claim 7.

13. A display device, comprising the display panel according to claim 12.

14. The profiling and laminating device, comprising: p1 a fixture including a first main surface, a curved transition surface and a second main surface that are connected in sequence, wherein the first main surface and the second main surface are located on two opposite sides of the fixture, respectively;

a carrier film, wherein a surface of the carrier film is used for carrying a flexible display panel, and another surface of the carrier film is used for covering at least the first main surface and the second main surface of the fixture;

a first driving assembly, the first driving assembly being configured to drive the fixture to move; and a second driving assembly, the second driving assembly being configured to drive the carrier film to move;

wherein the fixture includes:

a first extending portion extending in a first direction, the first extending portion including a first extending surface, a first curved extending surface and a second extending surface that are connected in sequence, the first extending surface being used as the first main surface, the first curved extending surface being used as the curved transition surface, the second extending surface being used as the second main surface;

a second extending portion being connected to the first extending surface and extending in a second direction intersecting the first direction;

wherein the first extending portion is configured to generate magnetic attraction force after being energized, and the carrier film is configured to be attracted by the magnetic attraction force generated by the first extending portion.

15. The profiling and laminating device according to claim 14, wherein the first extending portion includes:

a plurality of electromagnetic coils; and an extending body extending in the first direction, wherein a surface of the extending body has a plurality of grooves, and at least one electromagnetic coil of the plurality of electromagnetic coils is disposed in a groove of the plurality of grooves: or, a surface of the extending body has a plurality of grooves, at least one electromagnetic coil of the plurality of electromagnetic coils is disposed in a groove of the plurality of grooves, and a number of electromagnetic coils proximate to the first extending surface is less than a number of electromagnetic coils proximate to the second extending surface.

16. The profiling and laminating device according to claim 14, wherein the first extending portion further includes a second curved extending surface that connects the first extending surface and the second extending surface.

17. The profiling and laminating device according to claim 16, wherein the first extending portion includes a plurality of electromagnetic coils;

the second extending portion is connected to an edge portion of the first extending surface connected to the second curved extending surface, a surface of the second extending portion is smoothly connected to the second curved extending surface, and at least one electromagnetic coil of the plurality of electromagnetic coils is embedded in a surface of the second extending portion proximate to the second curved extending surface; or the second extending portion is connected to a middle portion of the first extending surface in the first direction; in all electromagnetic coils of the plurality of electromagnetic coils proximate to the first extending surface, a number of electromagnetic coils located on one side of two opposite sides of the first extending portion is different from a number of electromagnetic coils located on another side of the two opposite sides of the first extending portion.

18. A profiling and laminating device, comprising:

a fixture including a first main surface, a curved transition surface and a second main surface that are connected in sequence, wherein the first main surface and the second main surface are located on two opposite sides of the fixture, respectively;

a carrier film, wherein a surface of the carrier film is used for carrying a flexible display panel, and another surface of the carrier film is used for covering at least the first main surface and the second main surface of the fixture;

a first driving assembly, the first driving assembly being configured to drive the fixture to move; and a second driving assembly, the second driving assembly being configured to drive the carrier film to move;

wherein the carrier film includes:

a first carrier portion, the first carrier portion being configured to cover the first main surface under driving of the second driving assembly; and a second carrier portion, the second carrier portion being configured to cover the second main surface under driving of the second driving assembly.

19. The profiling and laminating device according to claim 18, further comprising a filling portion that connects the first carrier portion and the second carrier portion, wherein an elastic modulus of the filling portion is less than an elastic modulus of the first carrier portion; and/or, the elastic modulus of the filling portion is less than an elastic modulus of the second carrier portion.

20. The profiling and laminating device according to claim 18, wherein an elastic modulus of the carrier film is in a range from 3.8 Gpa to 9.9 Gpa, inclusive; or an elastic modulus of the carrier film is in a range from 3.8 Gpa to 9.9 Gpa inclusive; the profiling and laminating device further comprises an optical adhesive layer located on a surface of the carrier film that is used for carrying the flexible display panel; and an elastic modulus of the optical adhesive layer is in a range from 20 Gpa to 110 Gpa, inclusive.

* * * * *